United States Patent
Moriwaki

(10) Patent No.: US 8,072,080 B2
(45) Date of Patent: Dec. 6, 2011

(54) CONNECTION STRUCTURE, ELECTRO-OPTICAL DEVICE, AND METHOD FOR PRODUCTION OF ELECTRO-OPTICAL DEVICE

(75) Inventor: Minoru Moriwaki, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 286 days.

(21) Appl. No.: 11/962,618

(22) Filed: Dec. 21, 2007

(65) Prior Publication Data
US 2008/0149937 A1    Jun. 26, 2008

(30) Foreign Application Priority Data

Dec. 26, 2006  (JP) ................................ 2006-349725

(51) Int. Cl.
*H01L 23/48* (2006.01)
(52) U.S. Cl. ... 257/776; 257/72; 257/773; 257/E23.141; 257/E23.143; 257/E23.145; 257/E23.152; 257/E23.151; 438/637; 438/629
(58) Field of Classification Search .............. 349/42, 349/43; 438/637, 629; 257/E23.141, E23.143, 257/E23.145, E23.151, E23.152, 72, 773, 257/776
See application file for complete search history.

(56) References Cited

U.S. PATENT DOCUMENTS

| | | | |
|---|---|---|---|
| 5,424,575 A * | 6/1995 | Washio et al. | 257/526 |
| 6,909,487 B2 | 6/2005 | Eguchi | |
| 2004/0135952 A1 * | 7/2004 | Kurashina et al. | 349/139 |
| 2004/0195573 A1 * | 10/2004 | Kim | 257/72 |
| 2006/0243977 A1 * | 11/2006 | Yamasaki | 257/59 |

FOREIGN PATENT DOCUMENTS

| | | |
|---|---|---|
| CN | 2686095 Y | 3/2005 |
| JP | 06-034990 | 2/1994 |
| JP | 11-003938 | 1/1999 |
| JP | 2006-228944 | 8/2006 |
| JP | 2007-000986 | 1/2007 |

* cited by examiner

*Primary Examiner* — N Drew Richards
*Assistant Examiner* — Yu-Hsi D Sun
(74) *Attorney, Agent, or Firm* — Maschoff Gilmore & Israelsen

(57) ABSTRACT

The invention provides a connection structure including: a first electro-conductive film that is formed on a substrate; an insulation film that is formed on the first electro-conductive film, an end surface of the insulation film facing in a direction in which an end surface of the first electro-conductive film faces; and a second electro-conductive film that extends from the upper surface of the insulation film to reach the end surface of the first electro-conductive film across the end surface of the insulation film, the second electro-conductive film being electrically connected to the first electro-conductive film via the end surface of the first electro-conductive film.

5 Claims, 12 Drawing Sheets

NON-OPEN REGION | OPEN REGION

NON-OPEN REGION | OPEN REGION

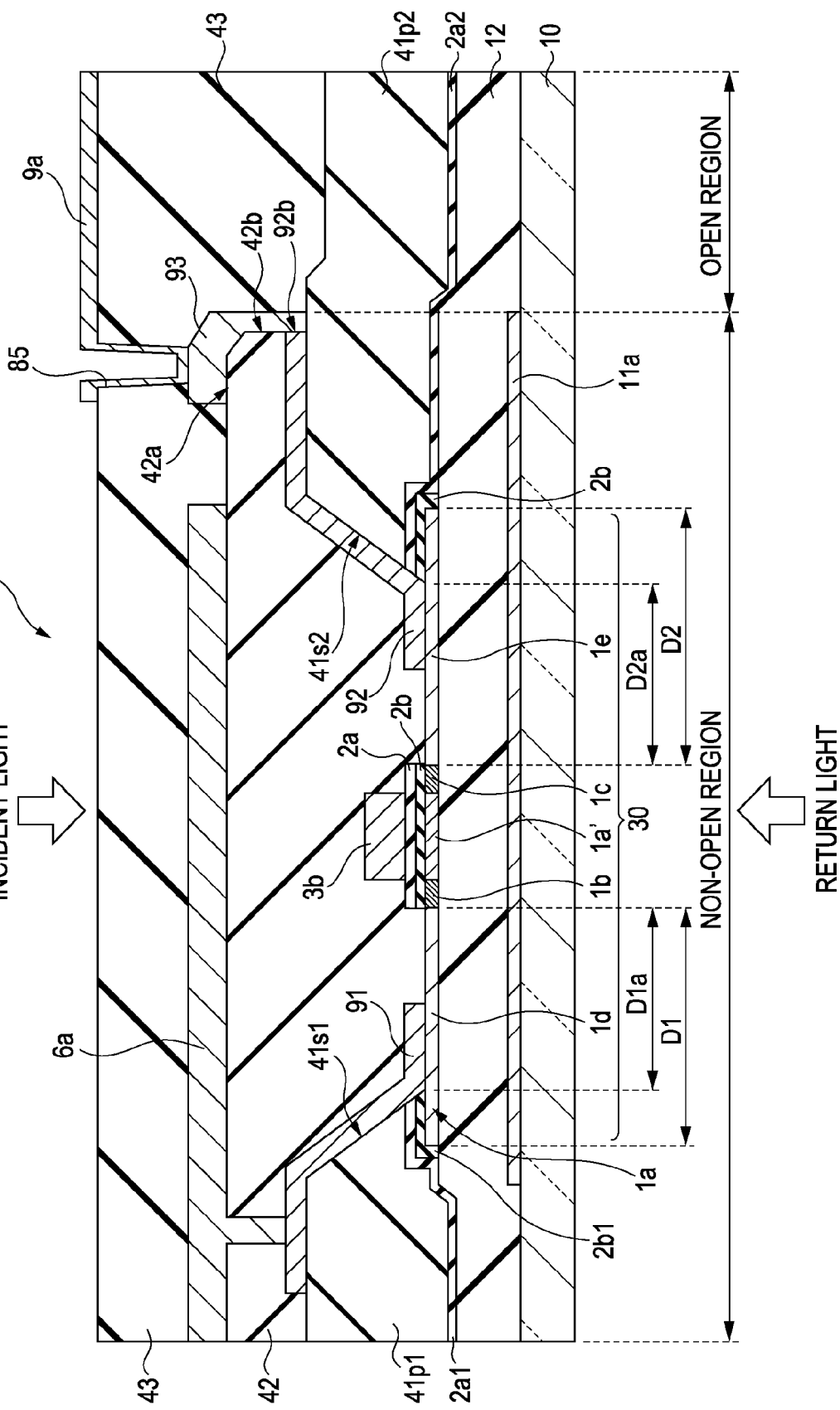

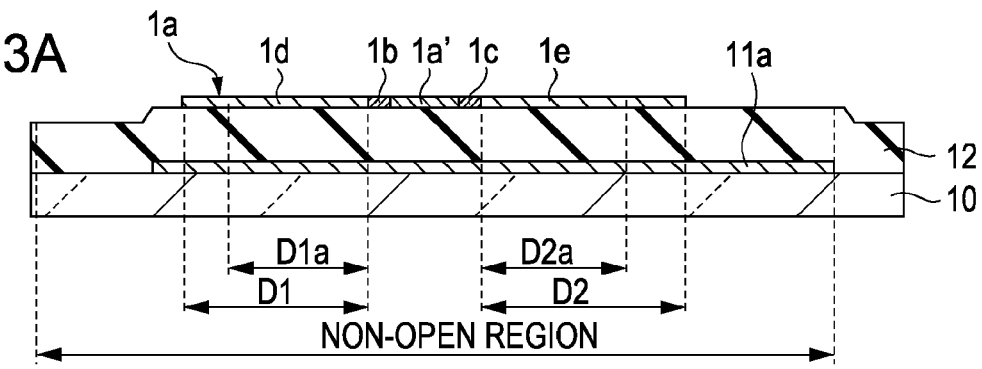
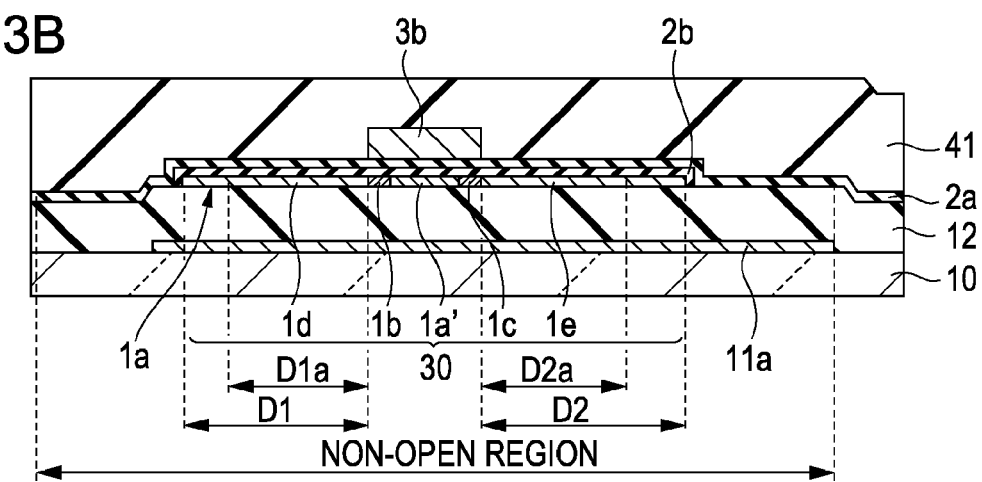
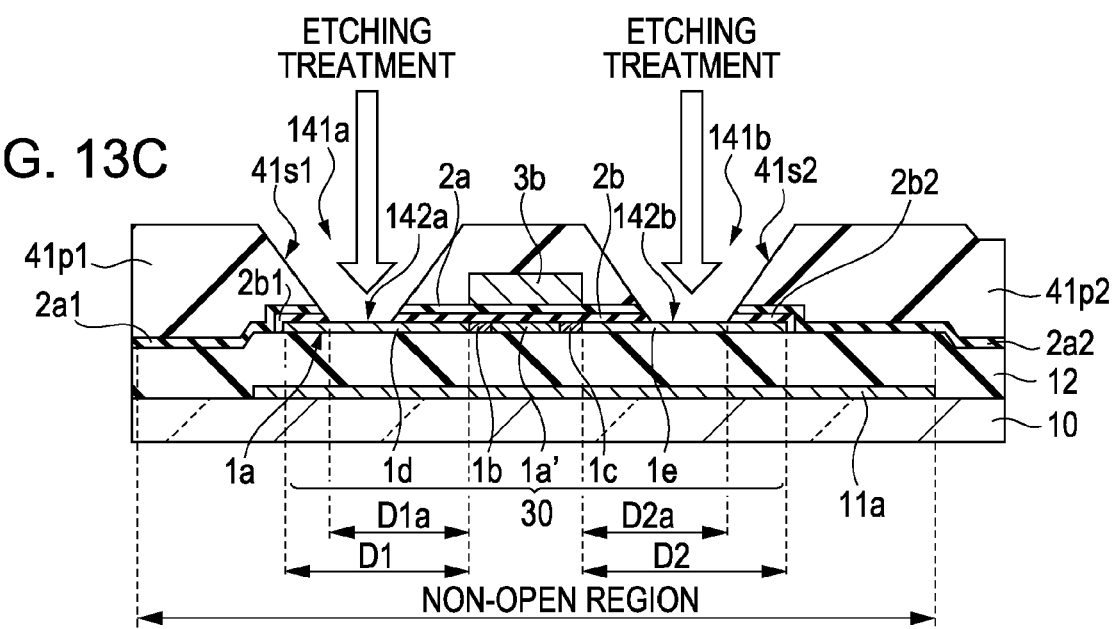

CONNECTION STRUCTURE, ELECTRO-OPTICAL DEVICE, AND METHOD FOR PRODUCTION OF ELECTRO-OPTICAL DEVICE

BACKGROUND

1. Technical Field

The present invention relates to a connection structure having, for example, an electro-conductive film provided on an insulation layer and another electro-conductive film provided under the insulation layer, where the first-mentioned electro-conductive film and the second-mentioned electro-conductive film are electrically connected to each other. The present invention further relates to an electro-optical device that adopts such a connection structure for electric connection between electro-conductive films such as pixel electrodes, wiring, though not limited thereto. In addition, the present invention relates to a method for manufacturing an electro-optical device having such a connection structure.

2. Related Art

In the configuration of a liquid crystal device, which is a non-limiting example of an electro-optical device having a related-art connection structure, each of pixel electrodes that are made of transparent electro-conductive films such as indium tin oxide (ITO) or the like is electrically connected to a relay layer, which is provided below the pixel electrode, via a contact hole. One technical problem of the related-art connection structure, which has a pixel electrode and a relay layer that are electrically connected to each other via a contact hole, lies in that it is difficult to provide a wide open area (i.e., a region that passes light) in a pixel layout configuration. Specifically, in order to establish an electric connection between a relay layer, which is not transparent, and a transparent pixel electrode via a contact hole, it is necessary to overlap a part of the relay layer and the pixel electrode in a plan view, or in other words, underlay a part of the relay layer with respect to the pixel electrode. For this reason, the opaque relay layer substantially narrows, within the entire region of a pixel, the dimension of the open area, which is an active area through which light can be transmitted/reflected. When forming a contact hole at an area where opaque constituent elements that block light, including but not limited to, wiring, a light-shielding film(s), and a semiconductor device(s), are provided, it is necessary to allocate a space margin in consideration of positional alignment between two types of masks used for removing a region of an insulation layer at which the contact hole is supposed to be bored. Since it is necessary to allocate a margin space, the ratio of non-open area to the entire region of a pixel is lowered. This means that it is difficult to enhance display performance by increasing an aperture ratio of the pixel (i.e., the percentage of the light-transmissive/reflective open area that occupies the region of the pixel).

As a known technical solution to the above-identified problem, JP-A-11-3938 discloses a connection structure in which two electro-conductive patterns are electrically connected to each other via a small contact region, where one of the above-mentioned two electro-conductive patterns is formed in a layer that is not the same as that of the other electro-conductive pattern with an insulation film (i.e., insulation layer) being interposed or sandwiched therebetween.

Disadvantageously, in the configuration disclosed in JP-A-11-3938, it is difficult to make the size of a connection electro-conductive film compact because the connection electro-conductive film extends onto the surface of an under-layer electro-conductive pattern of the above-mentioned two electro-conductive patterns. For this reason, the configuration disclosed in JP-A-11-3938 has a technical disadvantage in that the open area of a pixel is narrowed by such an overlapping portion of the connection electro-conductive film that extends onto the surface of the under-layer electro-conductive pattern of the above-mentioned two electro-conductive patterns.

On the other hand, when the source region of a pixel switching TFT, which is provided in each pixel region for the purpose of supplying an image signal to the corresponding one of pixel electrodes, and the drain region thereof are electrically connected to a data-line side wiring region and a pixel-electrode-side wiring region via contact holes (i.e., each via a contact hole), respectively, a coupling capacitance is undesirably generated between the data-line side wiring region and the pixel-electrode-side wiring region because of a potential difference therebetween. Then, the coupling capacitance generated between the data-line side wiring region and the pixel-electrode-side wiring region could cause the problem of defective display such as a horizontal crosstalk or other similar problems at the time of operation of an electro-optical device.

SUMMARY

An advantage of some aspects of the invention is to provide an electro-optical device that is capable of offering a high-quality image display, and further to provide a method for manufacturing such an electro-optical device. More essentially, an advantage of some aspects of the invention is to provide a novel and inventive connection structure that can be adopted in the configuration of such an electro-optical device.

In order to address the above-identified problem without any limitation thereto, the invention provides, as a first aspect thereof, a connection structure including: a first electro-conductive film that is formed on a substrate; an insulation film that is formed on the first electro-conductive film, an end surface of the insulation film facing in a direction in which an end surface of the first electro-conductive film faces; and a second electro-conductive film that extends from the upper surface of the insulation film to reach the end surface of the first electro-conductive film across the end surface of the insulation film, the second electro-conductive film being electrically connected to the first electro-conductive film via the end surface of the first electro-conductive film.

In the configuration of a connection structure according to the first aspect of the invention, an insulation film is formed on the first electro-conductive film; and in addition, an end surface of the insulation film faces in a direction in which an end surface of the first electro-conductive film faces. In other words, the end surface of the insulation film (one end surface) is oriented in the same direction as that of the end surface of the first electro-conductive film (another one end surface). In the preceding sentence, the term "one end surface" and the term "another end surface" put in parentheses are merely used for the purpose of differentiating the former with the latter without any significant meaning. That is, the above-mentioned "one end surface" of the insulation film signifies, among a plurality of end surfaces of the insulation film, an end surface that faces in a direction in which an (i.e., the corresponding) end surface of the first electro-conductive film faces (i.e., in the same direction). The end surface of the insulation film may lie on the same plane as that of the end surface of the first electro-conductive film. Or, as an example of alternative configuration, the end surface of the insulation film may be "protruded" when viewed with respect to the end surface of the first electro-conductive film. In other words, the above-described configuration may be modified as long as the end surface of the first electro-conductive film does not lie at a "protruded" position in comparison with the end surface of the insulation film.

The second electro-conductive film extends from the upper surface of the insulation film to reach the end surface of the first electro-conductive film across the end surface of the insulation film. Specifically, the second electro-conductive film is configured as an electrically conductive film that has a portion extending along the end surface of the insulation film and the end surface of the first electro-conductive film, each of which extends in a direction orthogonal to the surface of the substrate. The second electro-conductive film and the first electro-conductive film are electrically connected to each other via the end surface of the first electro-conductive film. Specifically, on the premise that the end surface of the insulation film lies on the same plane as that of the end surface of the first electro-conductive film, the second electro-conductive film and the first electro-conductive film are electrically connected to each other via the end surface of the first electro-conductive film, because the second electro-conductive film is configured to extend along the end surface of the insulation film and the end surface of the first electro-conductive film. It should be noted that the connection structure described above is also applicable to a modified configuration in which the end surface of the insulation film is protruded when viewed with respect to the end surface of the first electro-conductive film. That is, as in the above-described configuration, the second electro-conductive film and the first electro-conductive film are also electrically connected to each other via the end surface of the first electro-conductive film in such a modified configuration.

As described above, the second electro-conductive film extends from the upper surface of the insulation film to reach the end surface of the first electro-conductive film. In such a unique configuration of the connection structure according to the first aspect of the invention, the second electro-conductive film and the first electro-conductive film are electrically connected to each other via the end surface of the first electro-conductive film. The second electro-conductive film of the connection structure according to the first aspect of the invention is formed in a layer that is not the same as that of the first electro-conductive film with the insulation film being interposed therebetween.

Thus, the connection structure according to the first aspect of the invention makes it possible to achieve a smaller size, which is advantageous and desirable. That is, since the end surface of the first electro-conductive film in the connection structure according to the first aspect of the invention does not lie at a protruded position in comparison with the end surface of the insulation film thereof, it is possible to reduce the size of the connection structure having the first electro-conductive film and the second electro-conductive film.

As described above, the connection structure according to the first aspect of the invention, which is formed over the substrate though not necessarily limited thereto, makes it possible to achieve a smaller structure size while offering an electric connection between one of two circuit/wiring regions and the other thereof, where the above-mentioned one circuit/wiring region is formed in a layer that is not the same as that of the other with the insulation film being interposed therebetween. By this means, the connection structure according to the first aspect of the invention makes it possible to reduce the dimension of a circuit configuration that is provided on a limited space of the substrate. In particular, the connection structure according to the first aspect of the invention provides a space-efficient electric connection between two circuit/wiring regions one of which is formed in a layer that is not the same as that of the other, which could be adopted in the following cases though not limited thereto. For example, the connection structure according to the first aspect of the invention is advantageous in a case where there is a spatial restriction for formation of circuit/wiring regions on the substrate. The connection structure according to the first aspect of the invention is also advantageous in a case where it is necessary to reduce the size of a substrate or a circuit board on which circuit/wiring regions are formed. The connection structure according to the first aspect of the invention is also advantageous in a case where a multi-tier structure is adopted so as to reduce the planar size of circuit/wiring regions.

In order to address the above-identified problem without any limitation thereto, the invention provides, as a second aspect thereof, an electro-optical device including: a plurality of data lines and a plurality of scanning lines that intersect with each other on a substrate; a plurality of pixel electrodes each one of which is provided in corresponding one of a plurality of pixels, each one of the plurality of pixels being formed at a position corresponding to each intersection formed by the plurality of data lines and the plurality of scanning lines that intersect with each other; a first electro-conductive film that is formed at a non-open region that isolates one open region from another open region in a layout of the plurality of pixels arrayed adjacent to one another, the first electro-conductive film being electrically connected to the pixel electrode, the first electro-conductive film having an end surface that faces toward the open region; an insulation film that is formed on the first electro-conductive film, an end surface of the insulation film facing toward the open region; and a second electro-conductive film that extends from the upper surface of the insulation film to reach the end surface of the first electro-conductive film across the end surface of the insulation film, the second electro-conductive film being electrically connected to the first electro-conductive film via the end surface of the first electro-conductive film.

In the configuration of an electro-optical device according to the second aspect of the invention, for example, an image signal is supplied from the data line to the pixel electrode in a controlled manner so as to display an image in a so-called active matrix scheme. That is, for example, in the configuration of an electro-optical device according to the second aspect of the invention, a transistor that is electrically connected between the data line and the pixel electrode is turned ON/OFF. By this means, an image signal is supplied from the data line to the pixel electrode via the transistor at a predetermined timing. A plurality of pixel electrodes is arrayed in a matrix pattern at a region constituting an image display area on the substrate. Each of the pixel electrodes is formed at a position corresponding to each one of intersections formed by a plurality of data lines and a plurality of scanning lines that intersect with each other. Each of the pixel electrodes is configured as a transparent electrode, which is made of transparent electro-conductive material such as indium tin oxide (ITO) or the like.

The first electro-conductive film is formed at a non-open region that isolates one open region from another open region in a layout of the plurality of pixels arrayed adjacent to one another. The first electro-conductive film is electrically connected to the pixel electrode. Herein, the term "open region" means an active area in a pixel through which light can be transmitted (or reflected) without being shut off. At the open region, for example, a pixel electrode is formed. As the optical transmittance (i.e., light transmission factor) with respect to an incident light beam changes, the open region changes the gradation of an outgoing light beam, which has passed through an electro-optical material such as liquid crystal and the like. In other words, the term "open region" means an area where light incident on a pixel is not blocked by any light-shutting substance such as a wiring, a light-shutting film, or a chip device and/or a chip element, though not limited thereto, which does not pass light at all or has a relatively small light transmission factor in comparison with that of a transparent electrode. On the other hand, the term "non-open region" means an area which blocks or shuts off light that actually contributes to display. For example, a light-shutting substance that is not transparent such as a wiring, a light-shutting film, or a chip device and/or a chip element, though not limited thereto, is formed at the non-open region in a pixel.

The first electro-conductive film has an end surface that faces toward the open region. In the preceding sentence, "an end surface (that) faces toward the open region" does not mean that the end surface of the first electro-conductive film extends directly along (i.e., "in contact with") the open region, which is not the case. Instead, "an end surface (that) faces toward the open region" means that the end surface of the first electro-conductive film is oriented toward the open region with a second electro-conductive film being sandwiched therebetween. A detailed explanation of the second electro-conductive film will be given later.

An insulation film is formed on the first electro-conductive film, and has an end surface that faces toward the open region (one end surface). In the preceding sentence, the term "one end surface" put in parenthesis is merely used for the purpose of differentiating "one end surface" with "another end surface" without any significant meaning. That is, the above-mentioned "one end surface" of the insulation film signifies, among a plurality of end surfaces of the insulation film, an end surface that faces toward the open region. The end surface of the insulation film may lie on the same plane as that of the end surface of the first electro-conductive film. Or, as an example of alternative configuration, the end surface of the insulation film may be "protruded" when viewed with respect to the end surface of the first electro-conductive film. In other words, the above-described configuration may be modified as long as the end surface of the first electro-conductive film does not lie at a "protruded" position in comparison with the end surface of the insulation film.

The second electro-conductive film extends from the upper surface of the insulation film to reach the end surface of the first electro-conductive film across the end surface of the insulation film. The second electro-conductive film extends, for example, from the upper surface of the insulation film to reach the end surface of the first electro-conductive film across the end surface of the insulation film. Specifically, the second electro-conductive film is configured as an electrically conductive film that has a portion extending along the end surface of the insulation film and the end surface of the first electro-conductive film, each of which extends in a direction orthogonal to the surface of the substrate.

The second electro-conductive film and the first electro-conductive film are electrically connected to each other via the end surface of the first electro-conductive film. Specifically, on the premise that the end surface of the insulation film lies on the same plane as that of the end surface of the first electro-conductive film, the second electro-conductive film and the first electro-conductive film are electrically connected to each other via the end surface of the first electro-conductive film, because the second electro-conductive film is configured to extend along the end surface of the insulation film and the end surface of the first electro-conductive film. It should be noted that the connection structure described above is also applicable to a modified configuration in which the end surface of the insulation film is protruded when viewed with respect to the end surface of the first electro-conductive film. That is, as in the above-described configuration, the second electro-conductive film and the first electro-conductive film are also electrically connected to each other via the end surface of the first electro-conductive film in such a modified configuration.

As described above, the second electro-conductive film extends from the upper surface of the insulation film to reach the end surface of the first electro-conductive film. In such a unique configuration of the connection structure according to the first aspect of the invention, the second electro-conductive film and the first electro-conductive film are electrically connected to each other via the end surface of the first electro-conductive film. The second electro-conductive film of the connection structure according to the first aspect of the invention is formed in a layer that is not the same as that of the first electro-conductive film with the insulation film being interposed therebetween.

Therefore, in the configuration of an electro-optical device according to the second aspect of the invention, it is possible to significantly reduce the size of a protruding portion of the first electro-conductive film that extends from the non-open region into the open region. More preferably, it is not theoretically impossible to eliminate the protruding portion of the first electro-conductive film completely. Therefore, in comparison with a configuration in which the first electro-conductive film protrudes into the open region so that the first electro-conductive film and the second electro-conductive film are electrically connected to each other in the open region, which is disadvantageous and undesirable, the electro-optical device according to the second aspect of the invention makes it possible to reduce the dimension of the non-open region because the first electro-conductive film does not protrude into the open region.

Therefore, an electro-optical device according to the second aspect of the invention makes it possible to significantly reduce the dimension of a connection area that is required for electrically connecting the second electro-conductive film and the first electro-conductive film over the substrate, where the second electro-conductive film, which is electrically connected to the pixel electrode, is formed in a layer that is not the same as that of the first electro-conductive film. By this means, the electro-optical device according to the second aspect of the invention makes it possible to increase the aperture ratio of each pixel (i.e., the percentage of the light-transmissive/reflective open area that occupies the region of the pixel). Thus, an electro-optical device according to the second aspect of the invention makes it possible to enhance display performance by increasing the aperture ratio of each pixel.

In the configuration of an electro-optical device according to the second aspect of the invention, it is preferable that the second electro-conductive film is an island-pattern relay layer that electrically connects the first electro-conductive film and the pixel electrode; and a portion of the second electro-conductive film that extends on the upper surface of the insulation film is formed at the same layer as the data line.

In the preferred configuration described above, the second electro-conductive film is formed in the non-open region of each pixel so as to supply, for example, an image signal of a pixel electrode that is provided in each pixel. A portion of the second electro-conductive film that extends on the upper surface of the insulation film is formed at the same layer as the data line. The second electro-conductive film as well as the data line is manufactured by film deposition and patterning as follows. That is, an electro-conductive film that constitutes the data line and the second electro-conductive film are formed in the same single film formation step. Thereafter, the formed electro-conductive film is patterned into the data line and the second electro-conductive film. With such a manufacturing method, in comparison with a case where the second electro-conductive film is formed through a separate production step that is not the same as the data line formation step, it is possible to simplify the processes of manufacturing an electro-optical device.

In the configuration of an electro-optical device according to the second aspect of the invention, it is preferable that the first electro-conductive film is a semiconductor film; and the second electro-conductive film has a titanium film that contacts the semiconductor film.

With such a preferred configuration, when the second electro-conductive film is made of a semiconductor film such as polysilicon or the like, it is possible to "ohmic-contact" the first electro-conductive film and the second electro-conductive film thanks to the titanium film. By this means, it is possible to reduce a connection resistance between the first electro-conductive film and the second electro-conductive film.

In the configuration of an electro-optical device according to the second aspect of the invention, it is preferable that the second electro-conductive film has a metal film having an electric conductivity higher than that of the titanium film; and the second electro-conductive film further has a protective film that protects the metal film.

With such a preferred configuration, the metal film, which has an electric conductivity higher than that of the titanium film, enhances the electric conductivity of the second electro-conductive film. At the same time, with such a preferred configuration, the protective film prevents the metal film from becoming oxidized; and as a result thereof, it is possible to avoid an increase in electric resistance of the metal film. As a non-limiting example of the metal film, aluminum (Al) may be used. On the other hand, as a non-limiting example of the protective film, titanium nitride (TiN) may be used. The second electro-conductive film has a multilayer structure, which may be formed as a lamination of, for example, a titanium film, a titanium nitride film, an aluminum film, and another titanium nitride film. On the insulation film that is disposed on the first electro-conductive film, these component films are laminated one on another in the order of appearance herein to constitute the second electro-conductive film.

In order to address the above-identified problem without any limitation thereto, the invention provides, as a third aspect thereof, a method for producing an electro-optical device, including: a first step of forming a first electro-conductive film at a non-open region that isolates one open region from another open region in a layout of a plurality of pixels arrayed adjacent to one another, each one of the plurality of pixels being formed at a position corresponding to each intersection formed by a plurality of data lines and a plurality of scanning lines that intersect with each other on a substrate; a second step of forming an insulation film so as to cover the first electro-conductive film; a third step of removing a part of the insulation film so as to expose an end surface of the first electro-conductive film toward the open region; and a fourth step of forming a second electro-conductive film that extends from the upper surface of the insulation film to reach the end surface of the first electro-conductive film across an end surface of the insulation film, both of the end surface of the insulation film and the end surface of the first electro-conductive film being exposed as a result of the third step, the second electro-conductive film being electrically connected to the first electro-conductive film via the end surface of the first electro-conductive film.

In the method for producing an electro-optical device according to the third aspect of the invention, after the formation of the first electro-conductive film in the first step and the formation of the insulation film in the second step, a part of the insulation film is removed in the third step by means of a well-known film etching technique so as to expose an end surface of the first electro-conductive film toward the open region.

Then, in the fourth step, a second electro-conductive film is formed so as to extend from the upper surface of the insulation film to reach the end surface of the first electro-conductive film across an end surface of the insulation film, both of the end surface of the insulation film and the end surface of the first electro-conductive film being exposed as a result of the third step. In addition, the second electro-conductive film is electrically connected to the first electro-conductive film via the end surface of the first electro-conductive film, for example, only via the end surface of the first electro-conductive film without any other contact point therebetween.

That is, the method for producing an electro-optical device according to the third aspect of the invention makes it possible to significantly reduce the dimension of a non-open region that narrows an open region; that is, it is possible to offer the same advantageous effect/configuration as that of the electro-optical device according to the second aspect of the invention described above. By this means, the method for producing an electro-optical device according to the third aspect of the invention makes it possible to increase the aperture ratio of each pixel, which results in enhanced display performance of the electro-optical device.

In the method for producing an electro-optical device according to the third aspect of the invention described above, it is preferable that, in the third step, the part of the insulation film is removed by dry etching.

In such a preferred method, in comparison with a case where a wet etching technique is used, it is possible to remove the part of the insulation film in a selective manner so as to expose the end surface of the first electro-conductive film only by means of the dry etching technique.

In order to address the above-identified problem without any limitation thereto, the invention provides, as a fourth aspect thereof, an electro-optical device including: a plurality of data lines and a plurality of scanning lines that intersect with each other on a substrate; a plurality of pixel electrodes each one of which is provided in corresponding one of a plurality of pixels, each one of the plurality of pixels being formed at a position corresponding to each intersection formed by the plurality of data lines and the plurality of scanning lines that intersect with each other; a first portion that constitutes a part of an electro-conductive layer, the first portion being formed in a first region, and a second portion that constitutes another part of the electro-conductive layer, the second portion being formed in a second region, the electro-conductive layer being formed at a non-open region that isolates one open region from another open region in a layout of the plurality of pixels arrayed adjacent to one another, the electro-conductive layer having the first region and the second region over the substrate, the first region and the second region not overlapping each other in a plan view; a first insulating portion that has a first sloped surface, which is inclined downward with respect to the upper surface of the first portion when viewed along a direction from the first region toward the second region across an isolation region that is formed between the first region and the second region, the first insulating portion being formed to partially cover the surface of the first portion, leaving an exposed portion of the first region, the exposed portion of the first region constituting a first-portion region, the exposed first-portion region of the first region being closer to the isolation region that is formed between the first region and the second region than an unexposed region of the first region; a second insulating portion that has a second sloped surface, which is inclined downward with respect to the upper surface of the second portion when viewed along a direction from the second region toward the first region across the isolation region that is formed between the first region and the second region, the second insulating portion being formed to partially cover the surface of the second portion, leaving an exposed portion of the second region, the exposed portion of the second region constituting a second-portion region, the exposed second-portion region of the second region being closer to the isolation region that is formed between the first region and the second region than an unexposed region of the second region, the second insulating portion being formed on the same layer as that of the first insulating portion; a first electro-conductive film that extends from the upper surface of the first insulating portion onto the first sloped surface, the first electro-conductive film further extending from the first sloped surface to reach the upper surface of the first portion; and a second electro-conductive film that extends from the upper surface of the second insulating portion onto the second sloped surface, the second electro-conductive film further extending from the second sloped surface to reach the upper surface of the second portion, the second electro-conductive film having an electric potential that is not the same as one supplied to the first electro-conductive film.

In the configuration of an electro-optical device according to the fourth aspect of the invention, for example, an image signal is supplied from the data line to the pixel electrode, which is made of a transparent electro-conductive material such as indium tin oxide (ITO) or the like, in a controlled manner so as to display an image in a so-called active matrix scheme. In the technical point described above, an electro-optical device according to the fourth aspect of the invention has the same configuration as that of the electro-optical device according to the second aspect of the invention described above.

The first portion constitutes a part of an electro-conductive layer. The first portion is formed in a first region. The second portion constitutes another part of the electro-conductive layer. The second portion is formed in a second region. The electro-conductive layer is formed at a non-open region that isolates one open region from another open region in a layout of the plurality of pixels arrayed adjacent to one another. The electro-conductive layer has the first region and the second region over the substrate, where the first region and the second region do not overlap each other in a plan view. Therefore, the first portion extends in such a manner that it (i.e., the first portion) overlaps the first region in a plan view within the non-open region, where the first portion constitutes a part of the electro-conductive layer that extends from the first region (inclusive) to the second region (inclusive) within the non-open region.

The first insulating portion has the first sloped surface, which is inclined downward with respect to the upper surface of the first portion when viewed along a direction from the first region toward the second region across the isolation region that is formed between the first region and the second region. In addition, the first insulating portion is formed to partially cover the surface of the first portion, leaving an exposed portion of the first region. The exposed portion of the first region constitutes a first-portion region. The exposed first-portion region of the first region is closer to the isolation region that is formed between the first region and the second region than an unexposed region of the first region. Herein, the term "first-portion region" indicates a region that occupies an exposed part of the first region, where the exposed/occupied region is closer to the isolation region that is formed between the first region and the second region than an unexposed/unoccupied region of the first region.

The second insulating portion has the second sloped surface, which is inclined downward with respect to the upper surface of the second portion when viewed along a direction from the second region toward the first region across the isolation region that is formed between the first region and the second region. In addition, the second insulating portion is formed to partially cover the surface of the second portion, leaving an exposed portion of the second region. The exposed portion of the second region constitutes a second-portion region. The exposed second-portion region of the second region is closer to the isolation region that is formed between the first region and the second region than an unexposed region of the second region. The second insulating portion is formed on the same layer as that of the first insulating portion. In the configuration of an electro-optical device according to the fourth aspect of the invention, the first insulating portion and the second insulating portion may be manufactured as follows, though not necessarily limited thereto. A common insulation film, which spans the first region and the second region, is formed in a layer at which the first insulating portion and the second insulating portion are to be formed. Thereafter, the formed insulation film is selectively etched away at the following regions: the isolation region interposed between the first region and the second region, the inner part of the first-portion region that is closer to the isolation region than the outer part thereof, and the inner part of the second-portion region that is closer to the isolation region than the outer part thereof.

The first electro-conductive film extends from the upper surface of the first insulating portion onto the first sloped surface. The first electro-conductive film further extends from the first sloped surface to reach the upper surface of the first portion. Therefore, the first electro-conductive film is electrically connected to the first portion.

The second electro-conductive film extends from the upper surface of the second insulating portion onto the second sloped surface. The second electro-conductive film further extends from the second sloped surface to reach the upper surface of the second portion. Therefore, the second electro-conductive film is electrically connected to the second portion. In addition, the second electro-conductive film has an electric potential that is not the same as one supplied to the first electro-conductive film. Therefore, at the time of operation of an electro-optical device, a coupling capacitance tends to be generated between the first electro-conductive film and the second electro-conductive film. However, in the configuration of an electro-optical device according to the fourth aspect of the invention, because the gap between the first sloped surface and the second sloped surface is widened by gradual degrees thanks to the inclination of each of the first sloped surface and the second sloped surface, which means that the gap between the first electro-conductive film and the second electro-conductive film is also widened by gradual degrees in comparison with a case where the distance therebetween is constant, it is possible to reduce a coupling capacitance that is generated because of an electric potential difference between the first electro-conductive film and the second electro-conductive film.

That is, an electro-optical device according to the fourth aspect of the invention makes it possible to reduce a coupling capacitance that is generated between the second electro-conductive film, which is electrically connected to the pixel electrode, and the first electro-conductive film to which an electric potential that is not the same as one supplied to the second electro-conductive film is supplied. By this means, an electro-optical device according to the fourth aspect of the invention makes it possible to significantly reduce the occurrences of display problems such as a crosstalk, though not limited thereto, which is caused by a coupling capacitance that is generated on a signal supply path on which an image signal travels.

In the configuration of an electro-optical device according to the fourth aspect of the invention, it is preferable that the electro-conductive layer is a semiconductor layer; a partial region of the semiconductor layer extending within the isolation region formed between the first region and the second region thereof is a channel region; the first portion is a data-line-side electro-conductive portion that provides an electric connection at the data-line side when viewed from the channel region; and the second portion is a pixel-electrode-side electro-conductive portion that provides an electric connection at the pixel-electrode side when viewed from the channel region.

With such a preferred configuration, the semiconductor layer includes the channel region of a TFT, which is an example of a pixel-switching element that is electrically connected to the pixel electrode via the second electro-conductive film. The first portion is a data-line-side electro-conductive portion that provides an electric connection at the data-line side when viewed from the channel region. The data-line-side electro-conductive portion constitutes a source region of, for example, the TFT. On the other hand, the second portion is a pixel-electrode-side electro-conductive portion that provides an electric connection at the pixel-electrode side when viewed from the channel region. The pixel-electrode-side electro-conductive portion constitutes a drain region of the TFT.

With such a preferred configuration, an electro-optical device according to the fourth aspect of the invention makes it possible to reduce a coupling capacitance that is generated between a source wiring that is electrically connected to the source region of the TFT and a drain wiring that is electrically connected to the drain region of the TFT. By this means, an electro-optical device according to the fourth aspect of the invention makes it possible to significantly reduce the occurrences of display problems such as a crosstalk, though not limited thereto, which is caused by a coupling capacitance that is generated between the source wiring and the drain wiring.

In the configuration of an electro-optical device according to the fourth aspect of the invention, it is preferable that each of the first electro-conductive film and the second electro-conductive film has a titanium film that contacts the semiconductor layer.

With such a preferred configuration, it is possible to "ohmic-contact" a semiconductor layer such as polysilicon or the like and the first electro-conductive film and the second electro-conductive film each of which has a titanium film that contacts the semiconductor layer. By this means, it is possible to reduce a connection resistance between the semiconductor layer and the first electro-conductive film/the second electro-conductive film.

In the configuration of an electro-optical device according to the fourth aspect of the invention, it is preferable that each of the first electro-conductive film and the second electro-conductive film has a metal film having an electric conductivity higher than that of the titanium film; and the second electro-conductive film further has a protective film that protects the metal film.

With such a preferred configuration, the metal film, which has an electric conductivity higher than that of the titanium film, enhances the electric conductivity of each of the first electro-conductive film and the second electro-conductive film. At the same time, with such a preferred configuration, the protective film prevents the metal film from becoming oxidized; and as a result thereof, it is possible to avoid an increase in electric resistance of the metal film. As a non-limiting example of the metal film, aluminum (Al) may be used. On the other hand, as a non-limiting example of the protective film, titanium nitride (TiN) may be used. Each of the first electro-conductive film and the second electro-conductive film has a multilayer structure, which may be formed as a lamination of, for example, a titanium film, a titanium nitride film, an aluminum film, and another titanium nitride film. On the insulating portion that is disposed on each of the first portion and the second portion, these component films are laminated one on another in the order of appearance herein to constitute the first electro-conductive film/the second electro-conductive film.

In order to address the above-identified problem without any limitation thereto, the invention provides, as a fifth aspect thereof, a method for producing an electro-optical device, including: a first step of forming an electro-conductive layer at a non-open region that isolates one open region from another open region in a layout of a plurality of pixels arrayed adjacent to one another, each one of the plurality of pixels being formed at a position corresponding to each intersection formed by a plurality of data lines and a plurality of scanning lines that intersect with each other on a substrate, each one of a plurality of pixel electrodes being provided in corresponding one of the plurality of pixels, the electro-conductive layer having a first portion that is formed in a first region, the electro-conductive layer further having a second portion that is formed in a second region, the first region and the second region not overlapping each other in a plan view; a second step of forming an insulation layer on the electro-conductive layer; a third step of forming a first hole portion that penetrates through the insulation layer so as to expose a part of the first portion within the first region, the first hole portion having a first inner wall surface, which is inclined downward with respect to the upper surface of the first portion when viewed along a direction from the first region toward the second region across an isolation region that is formed between the first region and the second region; a fourth step of forming a second hole portion that penetrates through the insulation layer so as to expose a part of the second portion within the second region, the second hole portion having a second inner wall surface, which is inclined downward with respect to the upper surface of the second portion when viewed along a direction from the second region toward the first region across the isolation region that is formed between the first region and the second region; a fifth step of forming an electro-conductive film that extends from the upper surface of the insulation layer to reach a first exposed portion and that extends from the upper surface of the insulation layer to reach the second exposed portion, the first exposed portion being a part of the upper surface of the first portion at the bottom of the first hole portion, the second exposed portion being a part of the upper surface of the second portion at the bottom of the second hole portion; and a sixth step of removing the insulation layer and a part of the electro-conductive film at an isolation region that is interposed between the first region and the second region, at the inner part of a first-portion region of the first region that is closer to the isolation region than the remaining outer part of the first-portion region of the first region, and at the inner part of a second-portion region of the second region that is closer to the isolation region than the remaining outer part of the second-portion region of the second region.

In a method for producing an electro-optical device according to the fifth aspect of the invention, for example, an image signal is supplied from the data line to the pixel electrode, which is made of a transparent electro-conductive material such as indium tin oxide (ITO) or the like, in a controlled manner so as to display an image in a so-called active matrix scheme. In the technical point described above, a method for producing an electro-optical device according to the fifth aspect of the invention has the same configuration as that of the method for producing an electro-optical device according to the third aspect of the invention described above.

In the first step, an electro-conductive layer is formed at a non-open region that isolates one open region from another open region in a layout of a plurality of pixels arrayed adjacent to one another. Each one of the plurality of pixels is formed at a position corresponding to each intersection formed by a plurality of data lines and a plurality of scanning lines that intersect with each other on a substrate. Each one of a plurality of pixel electrodes is provided in corresponding one of the plurality of pixels. The electro-conductive layer has a first portion that is formed in a first region. The electro-conductive layer further has a second portion that is formed in a second region. The first region and the second region do not overlap each other in a plan view. In the second step, an insulation layer is formed on (i.e., to cover) the electro-conductive layer.

In the third step, which is performed either prior to the fourth step (i.e., separate pre-step) or concurrently with the fourth step (i.e., same single step), a first hole portion is formed. The first hole portion penetrates through the insulation layer so as to expose a part of the first portion within the first region. The first hole portion has a first inner wall surface, which is inclined downward with respect to the upper surface of the first portion when viewed along a direction from the first region toward the second region across an isolation region that is formed between the first region and the second region.

In the fourth step, which is performed either prior to the third step (i.e., separate pre-step) or concurrently with the third step (i.e., same single step), a second hole portion is formed. The second hole portion penetrates through the insulation layer so as to expose a part of the second portion within the second region. The second hole portion has a second inner wall surface, which is inclined downward with respect to the upper surface of the second portion when viewed along a direction from the second region toward the first region across the isolation region that is formed between the first region and the second region. Therefore, after completion of the third step and the fourth step, there remains a part of the insulation layer that was not etched away at the time of the formation of the first hole portion and the second hole portion over the isolation region that is formed between the first region and the second region. It should be noted that, when selected regions of the insulation layer are etched away in each of the third step and the fourth step described above, a predetermined pattern of a resist film may be deposited so as to form the first hole portion and the second hole portion therethrough. Or, the third step and the fourth step may be executed as a single integrated etching step to form the first hole portion and the second hole portion at the same time.

In the fifth step, an electro-conductive film is formed. The electro-conductive film extends from the upper surface of the insulation layer to reach a first exposed portion and extends from the upper surface of the insulation layer to reach the second exposed portion. The first exposed portion is a part of the upper surface of the first portion at the bottom of the first hole portion. The second exposed portion is a part of the upper surface of the second portion at the bottom of the second hole portion. The electro-conductive film has a monolithic structure or multi-tiered structure made of a conductive material. The top portion of the electro-conductive film that extends on the upper surface of the insulation film is formed in a layer that is not the same as that of the semiconductor layer with the insulation film being interposed therebetween. The electro-conductive film extends from the upper surface of the insulation film to go down along the first hole portion. On the other hand, the top portion of the electro-conductive film that extends on the upper surface of the insulation film is formed in a layer that is not the same as that of the semiconductor layer with the insulation film being interposed therebetween. The electro-conductive film extends from the upper surface of the insulation film to go down along the second hole portion.

In the sixth step, the insulation layer and a part of the electro-conductive film are removed at the following selected regions: the isolation region that is interposed between the first region and the second region, the inner part of a first-portion region of the first region that is closer to the isolation region than the remaining outer part (i.e., the remaining part excluding the inner part) of the first-portion region of the first region, and the inner part of a second-portion region of the second region that is closer to the isolation region than the remaining outer part of the second-portion region of the second region. Accordingly, after completion of the sixth step, the insulation layer has been selectively removed at the region between the first inner wall surface and the second wall surface, including the isolation region that is interposed between the first region and the second region. In addition, a part of the electro-conductive film is removed at the following selected regions: the isolation region that is interposed between the first region and the second region, the inner part of the first-portion region of the first region that is closer to the isolation region than the outer part of the first-portion region of the first region, and the inner part of the second-portion region of the second region that is closer to the isolation region than the outer part of the second-portion region of the second region. Therefore, the remaining (i.e., remaining without being etched away) electro-conductive film has a portion that extends from the upper surface of the remaining insulation film to go down along the first inner wall surface, reaching onto the first portion; and the remaining electro-conductive film has another portion that extends from the upper surface of the remaining insulation film to go down along the second inner wall surface, reaching onto the second portion. With such a configuration, the gap between the first inner wall surface and the second inner wall surface is widened by gradual degrees thanks to the inclination of each of the sloped surfaces, which means that the gap between one portion (e.g., left portion in the drawing, the first portion) of the remaining electro-conductive film and another portion (e.g., right portion in the drawing, the second portion) of the remaining electro-conductive film is also widened by gradual degrees in comparison with a case where the distance therebetween is constant.

In the method for producing an electro-optical device according to the fifth aspect of the invention, it is possible to reduce a coupling capacitance that is otherwise generated because of an electric potential difference between these remaining portions of the electro-conductive film thanks to the widened gap therebetween. Thus, the production method according to the fifth aspect of the invention offers an electro-optical device that is substantially free from display problems such as a crosstalk, though not limited thereto.

In the method for producing an electro-optical device according to the fifth aspect of the invention, it is preferable that, in the sixth step, a dry etching method, according to which the ratio of gas components to be ejected onto the insulation layer and the electro-conductive film is adjustable, is used for selectively removing the insulation layer and the part of the electro-conductive film.

With such a preferred method, since the component ratio of gas (i.e., gas ratio) that is to be ejected onto an etching target region can be adjusted when a dry etching method is used for selectively removing the insulation layer and the part of the electro-conductive film, it is possible to selectively etch away the isolation region interposed between the first region and the second region, the inner part of the first-portion region that is closer to the isolation region than the outer part thereof, and the inner part of the second-portion region that is closer to the isolation region than the outer part thereof.

In the method for producing an electro-optical device according to the fifth aspect of the invention, it is preferable that the electro-conductive layer is a semiconductor layer; a partial region of the semiconductor layer extending within the isolation region formed between the first region and the second region thereof is a channel region; the first portion is a data-line-side electro-conductive portion that provides an electric connection at the data-line side when viewed from the channel region; the second portion is a pixel-electrode-side electro-conductive portion that provides an electric connection at the pixel-electrode side when viewed from the channel region; and, in the sixth step, each of the data-line-side electro-conductive portion and the pixel-electrode-side electro-conductive portion functions also as an etching stopper, which prevents other layer components that are disposed under the semiconductor layer from being etched away.

In such a preferred method, the electro-conductive layer is the semiconductor layer that includes the channel region of a TFT, which is an example of a pixel-switching element. In addition, in such a preferred method, for example, the first portion constitutes a source region of the TFT, whereas the second portion constitutes a drain region of the TFT. When the dry etching treatment is applied to these films, each of the source region and the drain region functions also as an etching stopper, which prevents other layer components that are disposed under the semiconductor layer from being etched away.

These and other features, operations, and advantages of the present invention will be fully understood by referring to the following detailed description in conjunction with the accompanying drawings.

BRIEF DESCRIPTION OF THE DRAWINGS

The invention will be described with reference to the accompanying drawings, wherein like numbers reference like elements.

FIG. 12 is a sectional view that schematically illustrates an exemplary configuration of pixel units of an electro-optical device according to a third embodiment of the invention.

FIGS. 13A, 13B, and 13C is a first-half set of sectional view that schematically illustrates major production steps/processes of a method for producing an electro-optical device according to the third embodiment of the invention.

DESCRIPTION OF EXEMPLARY EMBODIMENTS

With reference to the accompanying drawings, an explanation is given of each of the following various aspects of the invention: a connection structure according to a first exemplary embodiment of the invention (in the foregoing summary explanation as well as in the following detailed description, this aspect of the invention may be referred to as "first aspect of the invention", if the context allows) (the same applies hereunder), an electro-optical device according to a second exemplary embodiment of the invention ("second aspect of the invention"), a method for manufacturing an electro-optical device according to a third exemplary embodiment of the invention ("third aspect of the invention"), an electro-optical device according to a fourth exemplary embodiment of the invention ("fourth aspect of the invention"), and a method for manufacturing an electro-optical device according to a fifth exemplary embodiment of the invention ("fifth aspect of the invention").

First Embodiment

Figure 1:
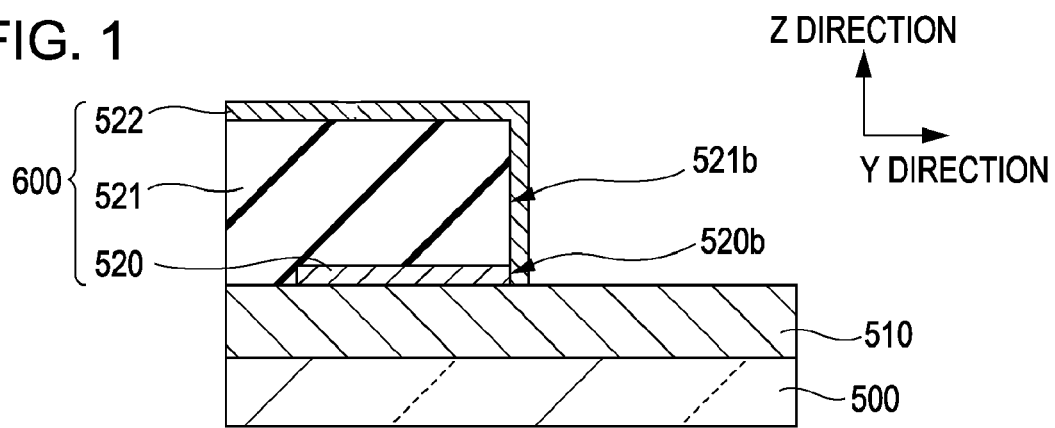
FIG. 1 is a sectional view that schematically illustrates an example of a connection structure according to a first embodiment of the invention.
Figure 2:
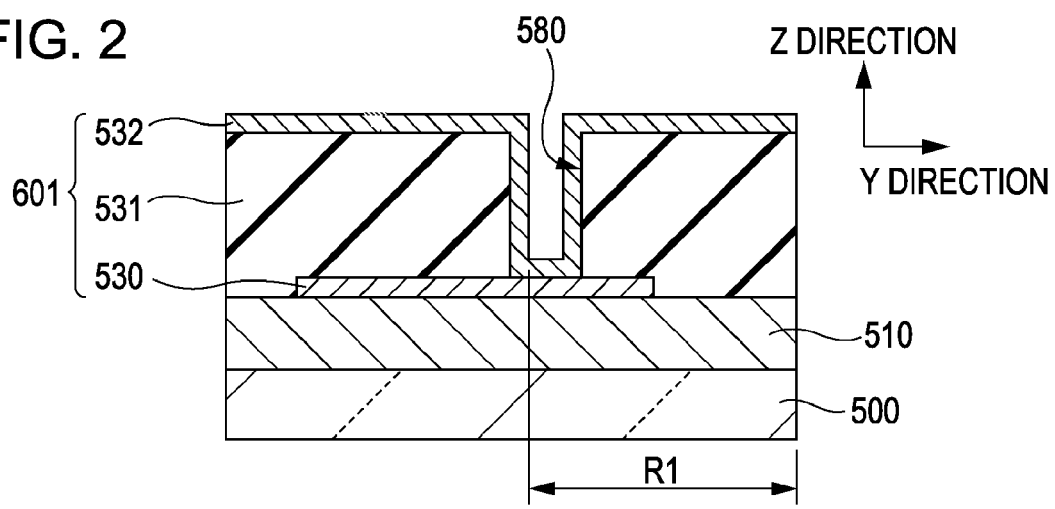
FIG. 2 is a sectional view that schematically illustrates an example of a connection structure of related art, which shows a first comparative example for facilitating the understanding of the connection structure according to the first embodiment of the invention.
Figure 3:
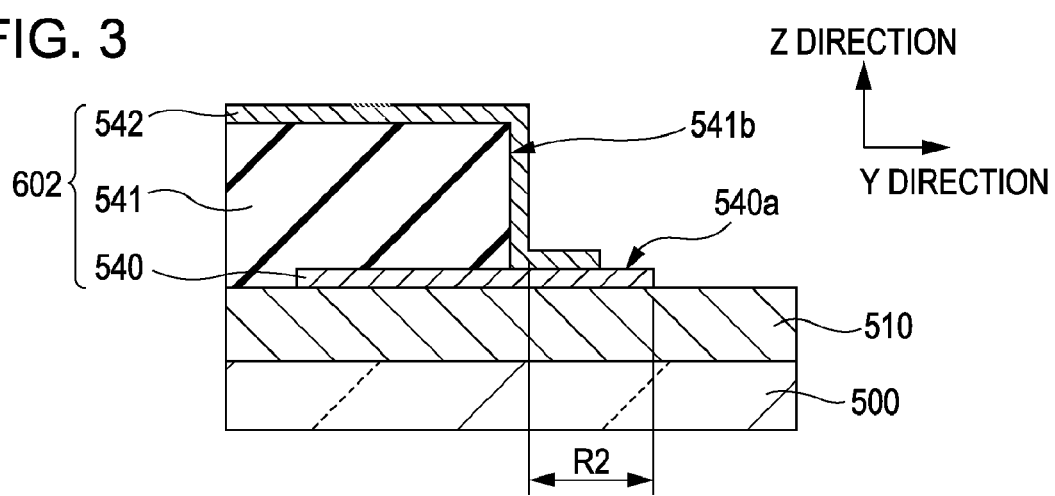
FIG. 3 is a sectional view that schematically illustrates an example of a connection structure of related art, which shows a second comparative example for facilitating the understanding of the connection structure according to the first embodiment of the invention.

First of all, with reference to FIGS. 1, 2, and 3, a connection structure according to the first aspect of the invention is explained. FIG. 1 is a sectional view that schematically illustrates an example of a connection structure according to the first embodiment of the invention. FIG. 2 is a sectional view that schematically illustrates an example of a connection structure of related art, which shows a comparative example for facilitating the understanding of the connection structure according to the first embodiment of the invention. FIG. 3 is a sectional view that schematically illustrates another example of a connection structure of related art, which shows another comparative example for facilitating the understanding of the connection structure according to the first embodiment of the invention.

As shown in FIG. 1, a connection structure 600 according to the present embodiment of the invention has a first electro-conductive film 520, an insulation film 521, and a second electro-conductive film 522. The connection structure 600 that is made up of the first electro-conductive film 520, the insulation film 521, and the second electro-conductive film 522 is deposited on an underlying foundation (i.e., base) layer 510 that is formed on a substrate 500.

The first electro-conductive film 520 is deposited on the underlying foundation layer 510 so as to have a predetermined film size by means of a known film deposition technique. The insulation film 521 is formed on the first electro-conductive film 520. An end surface (i.e., end face or end facet) 521b of the insulation film 521 faces in a direction in which an end surface 520b of the first electro-conductive film 520 faces (i.e., in the Y direction shown by an arrow in the drawing). In other words, the end surface 521b of the insulation film 521 is oriented in the same direction as that of the end surface 520b of the first electro-conductive film 520, that is, the Y direction. In the illustrated example, the end surface 521b of the insulation film 521 lies on the same plane as that of the end surface 520b of the first electro-conductive film 520, where the plane extends in a direction orthogonal to the surface of the substrate 500. Notwithstanding the foregoing, as an example of alternative configuration, the end surface 521b of the insulation film 521 may be "protruded" in the Y direction, that is, may lie at a greater Y-axial position, when viewed with respect to the end surface 520b of the first electro-conductive film 520. In other words, the illustrated configuration of the present embodiment of the invention may be modified as long as the end surface 520b of the first electro-conductive film 520 does not lie at a "protruded" greater Y-axial position in comparison with the end surface 521b of the insulation film 521.

The second electro-conductive film 522 is deposited to cover the upper surface of the insulation film 521, the end surface 521b thereof, and the end surface 520b of the first electro-conductive film 520 in such a manner that it extends from the upper surface of the insulation film 521 to reach the end surface 520b of the first electro-conductive film 520 across the end surface 521b of the insulation film 521. Specifically, the second electro-conductive film 522 is configured as an electrically conductive film that has a portion extending along the end surface 521b of the insulation film 521 and the end surface 520b of the first electro-conductive film 520, each of which extends in a direction orthogonal to the surface of the substrate 500 (i.e., in the Z direction shown by an arrow in the drawing). The second electro-conductive film 522 and the first electro-conductive film 520 are electrically connected to each other via the end surface 520b of the first electro-conductive film 520 only, which means that there is no other contact point therebetween. Specifically, on the premise that the end surface 521b of the insulation film 521 lies on the same plane as that of the end surface 520b of the first electro-conductive film 520 as in the illustrated configuration of the connection structure 600 according to the present embodiment of the invention, the second electro-conductive film 522 and the first electro-conductive film 520 are electrically connected to each other via the end surface 520b of the first electro-conductive film 520 only, meaning that there is no other contact point therebetween, because the second electro-conductive film 522 is configured to extend along the end surface 521b of the insulation film 521 and the end surface 520b of the first electro-conductive film 520.

In contrast, in the configuration of a connection structure 601 illustrated in FIG. 2, which shows a comparative example for facilitating the understanding of the connection structure 600 according to the present embodiment of the invention, a second electro-conductive film 532 is formed to cover both the upper surface of an insulation film 531 and the inner surface, that is, inner wall, of a hole portion 580, which penetrates through the insulation film 531. In such a configuration, the second electro-conductive film 532 is electrically connected to a first electro-conductive film 530 via a partial region of the upper surface of the first electro-conductive film 530, which is exposed to the outside via the hole 580 (to be more exact, the second electro-conductive film 532 covers the "exposed" partial region of the upper surface of the first electro-conductive film 530). In comparison with the connection structure 600 according to the present embodiment of the invention, which is illustrated in FIG. 1, the connection structure 601 illustrated in FIG. 2 has a larger size by the Y-axial dimension of a region R1, which is disadvantageous and undesirable.

In the configuration of a connection structure 602 illustrated in FIG. 3, which shows another comparative example for facilitating the understanding of the connection structure 600 according to the present embodiment of the invention, an end surface of a first electro-conductive film 540 is "protruded" in the Y direction, that is, lies at a greater Y-axial position, when viewed with respect to an end surface 541b of an insulation film 541. In addition, in the configuration of the connection structure 602, a second electro-conductive film 542 extends onto the upper surface 540a of the first electro-conductive film 540. In comparison with the connection structure 600 according to the present embodiment of the invention, which is illustrated in FIG. 1, the connection structure 602 illustrated in FIG. 3 has a larger size by the Y-axial dimension of a region R2, which is disadvantageous and undesirable.

In comparison with the related-art connection structures 601 and 602 illustrated in FIGS. 2 and 3, respectively, in the configuration of the connection structure 600 according to the present embodiment of the invention, which is illustrated in FIG. 1, the second electro-conductive film 522 extends from the upper surface of the insulation film 521 to reach the end surface 520b of the first electro-conductive film 520. In such a unique configuration of the connection structure 600 according to the present embodiment of the invention, the second electro-conductive film 522 and the first electro-conductive film 520 are electrically connected to each other via the end surface 520b of the first electro-conductive film 520 only, which means that there is no other contact point therebetween. In a manner similar to the counterparts of the related-art connection structures 601 and 602, the second electro-conductive film 522 of the connection structure 600 according to the present embodiment of the invention is formed in a layer that is not the same as that of the first electro-conductive film 520 thereof with the insulation film 521 being interposed (i.e., sandwiched) therebetween.

Thus, in comparison with these related-art connection structures in which the end surface of the first electro-conductive film is protruded in the Y direction, that is, lies at a greater Y-axial position, when viewed with respect to the end surface of the insulation film, and in addition, in which the second electro-conductive film extends onto a part of the upper surface of the first electro-conductive film, the connection structure 600 according to the present embodiment of the invention makes it possible to achieve a smaller size, which is advantageous and desirable. That is, since the end surface 520*b* of the first electro-conductive film 520 in the connection structure 600 according to the present embodiment of the invention does not lie at a protruded greater Y-axial position in comparison with the end surface 521*b* of the insulation film 521 thereof, it is possible to reduce the Y-directional size of the connection structure (600) having the first electro-conductive film (520) and the second electro-conductive film (522).

As described above, the connection structure 600 according to the present embodiment of the invention, which is formed over the substrate 500, makes it possible to achieve a smaller structure size while offering an electric connection between one of two circuit/wiring regions and the other thereof, where the above-mentioned one circuit/wiring region is formed in a layer (e.g., upper layer) that is not the same as that (e.g., lower layer) of the other with the insulation film 521 being interposed therebetween. By this means, the connection structure 600 according to the present embodiment of the invention makes it possible to reduce the dimension of a circuit configuration that is provided on a limited space of the substrate 500. In particular, the connection structure 600 according to the present embodiment of the invention provides a space-efficient electric connection between two circuit/wiring regions one of which is formed in a layer that is not the same as that of the other, which could be adopted in the following cases though not limited thereto. For example, the connection structure 600 is advantageous in a case where there is a spatial restriction for formation of circuit/wiring regions on the substrate 500. The connection structure 600 is also advantageous in a case where it is necessary to reduce the size of a substrate (i.e., circuit board) on which circuit/wiring regions are formed. The connection structure 600 is also advantageous in a case where a multi-tier structure is adopted so as to reduce the planar size of circuit/wiring regions.

It should be noted that the space-saving connection structure described above is also applicable to a modified configuration in which the end surface 521*b* of the insulation film 521 is protruded in the Y direction, that is, lies at a greater Y-axial position, when viewed with respect to the end surface 520*b* of the first electro-conductive film 520. That is, even in such a modified configuration, it is possible to make the size of the connection structure 600 smaller since the second electro-conductive film 522 and the first electro-conductive film 520 are electrically connected to each other via the end surface 520*b* of the first electro-conductive film 520 only, meaning that there is no other contact point therebetween.

Second Embodiment 2-1 Electro-Optical Device

Figure 4:
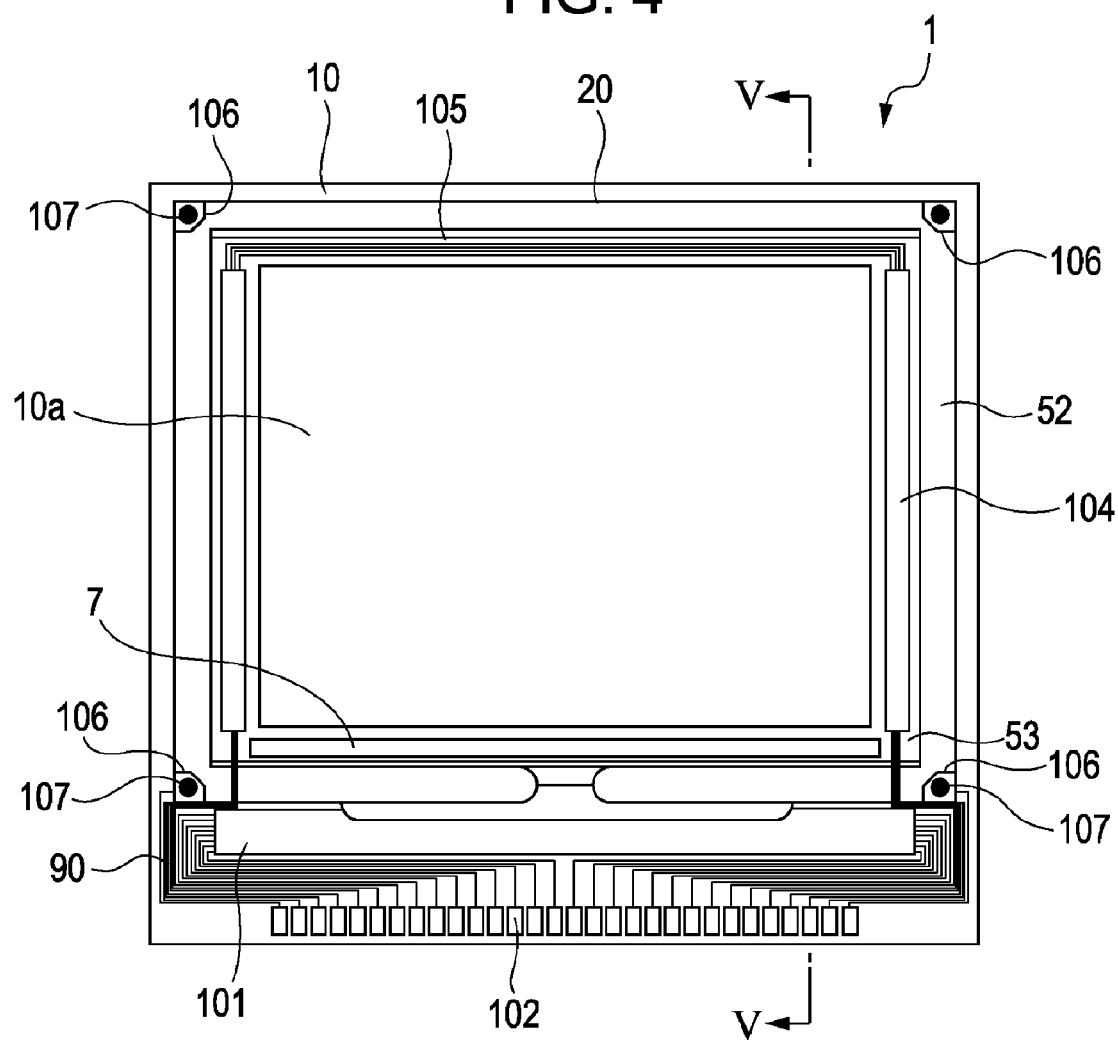
FIG. 4 is a plan view that schematically illustrates an example of the configuration of an electro-optical device according to a second embodiment of the invention.
Figure 5:
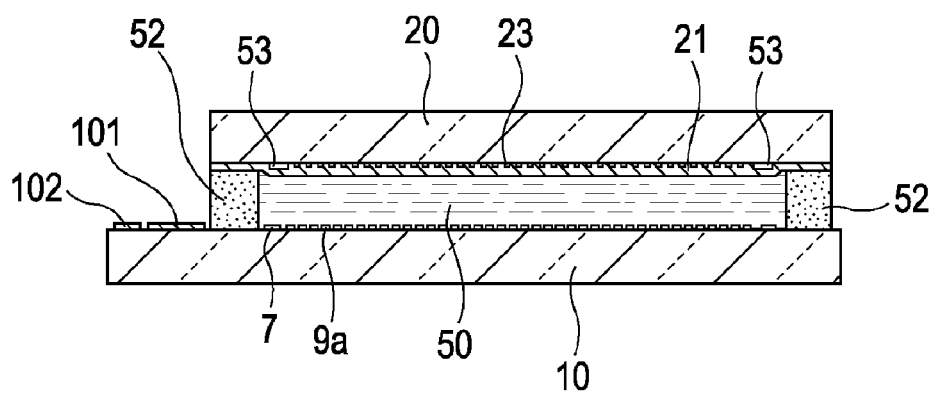
FIG. 5 is a sectional view taken along the line V-V of FIG. 4.
Figure 6:
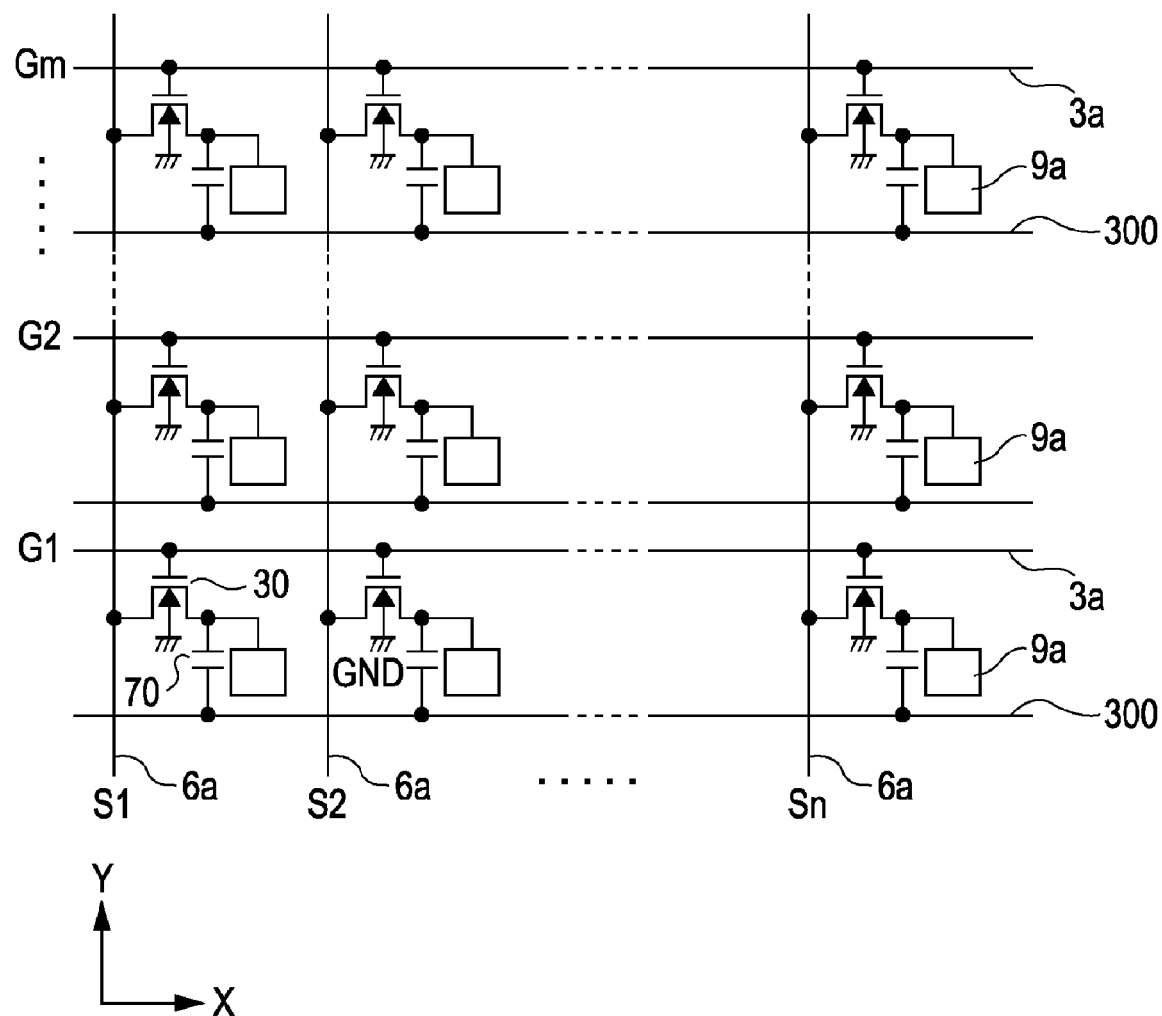
FIG. 6 is an equivalent circuit diagram that illustrates an example of a plurality of pixel units of the electro-optical device according to the second embodiment of the invention.
Figure 7:
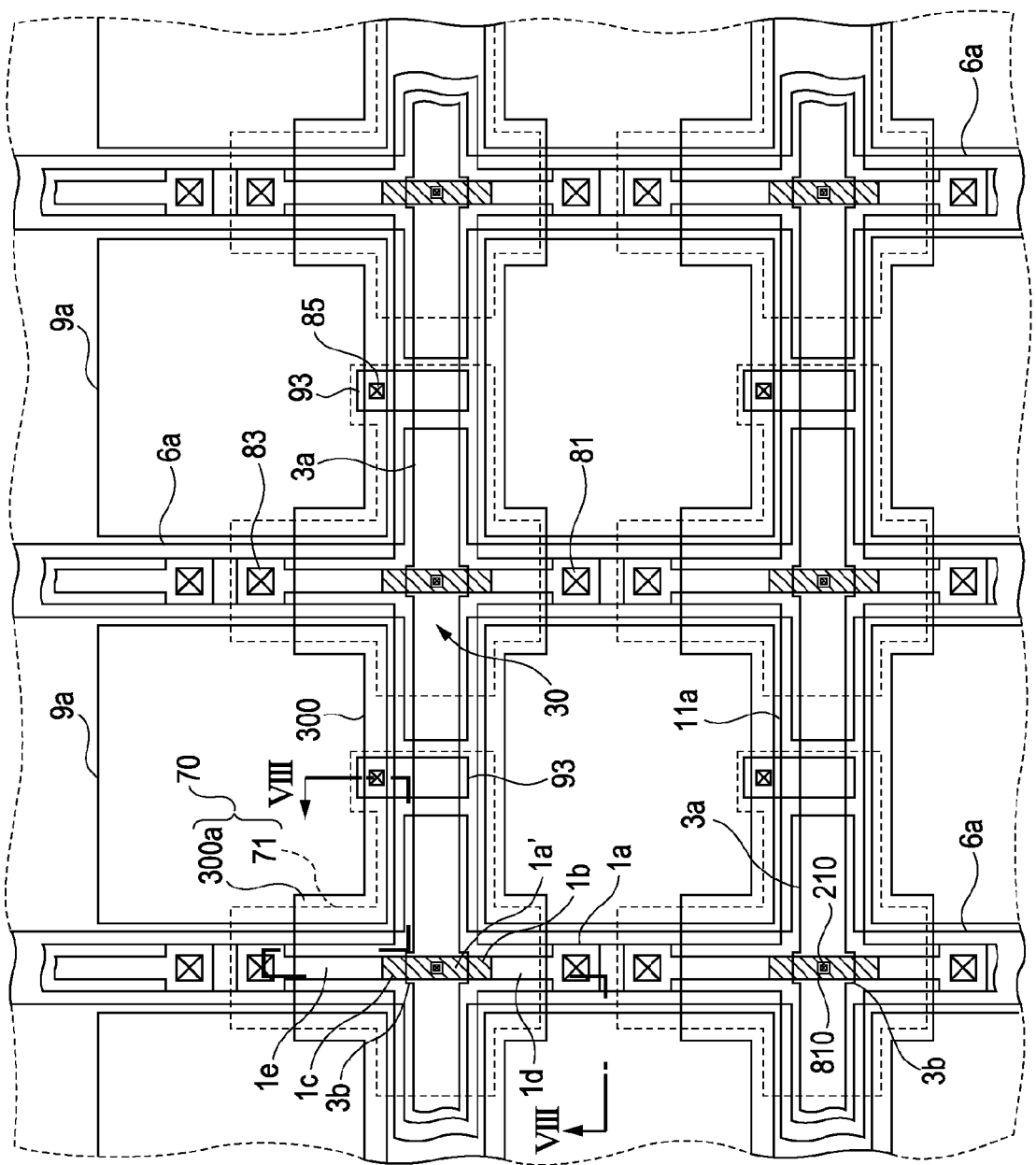
FIG. 7 is a plan view that schematically illustrates an example of the plurality of pixel units of the electro-optical device according to the second embodiment of the invention.
Figure 8:
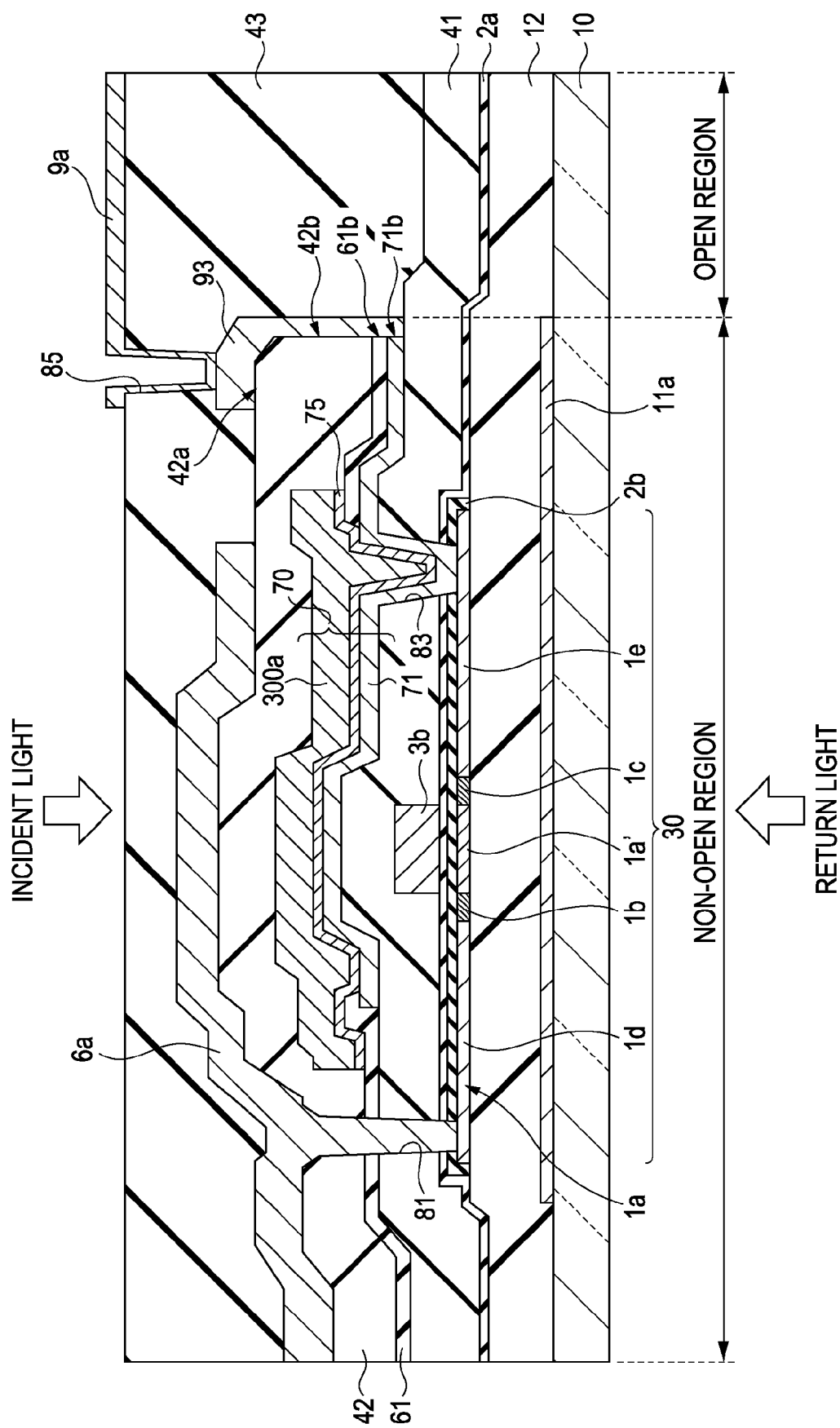
FIG. 8 is a sectional view taken along the line VIII-VIII of FIG. 7.
Figure 9A:
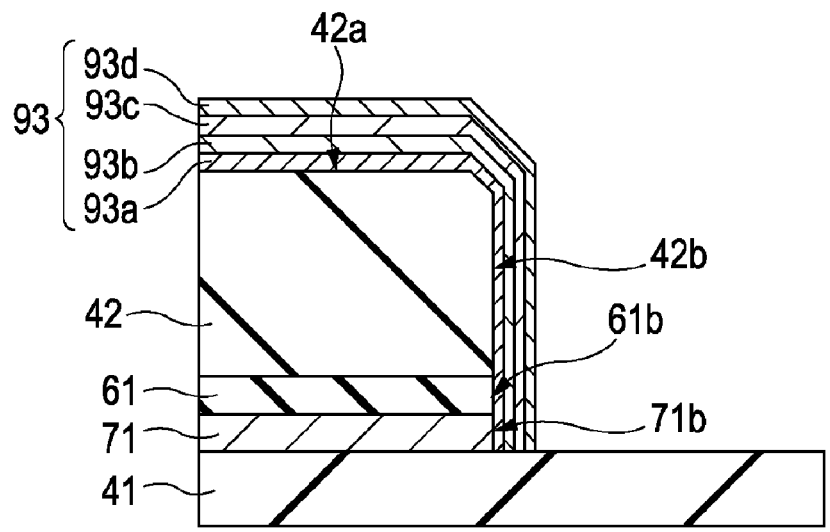
FIGS. 9A and 9B is a set of sectional views that schematically illustrates an example of the layer structure of a relay layer.
Figure 9B:
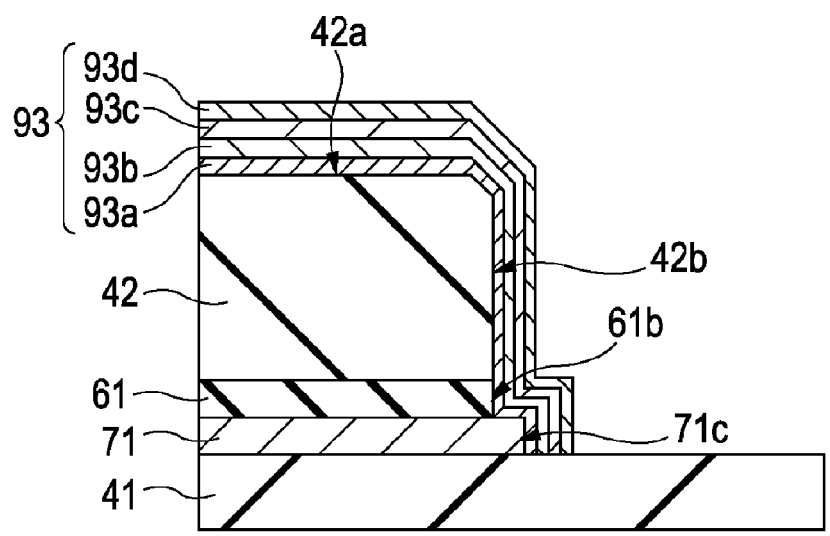

Next, with reference to FIGS. 4-9, an electro-optical device according to the second aspect of the invention is explained below. FIG. 4 is a plan view that schematically illustrates an example of an electro-optical device according to the second embodiment of the invention. FIG. 5 is a sectional view taken along the line V-V of FIG. 4. FIG. 6 is an equivalent circuit diagram that illustrates an example of a plurality of pixel units of the electro-optical device according to the second embodiment of the invention. FIG. 7 is a plan view that illustrates an example of the plurality of pixel units of the electro-optical device according to the second embodiment of the invention. FIG. 8 is a sectional view taken along the line VIII-VIII of FIG. 7. FIGS. 9A and 9B is a set of sectional views that schematically illustrates an example of the layer structure of a relay layer 93.

As shown in FIGS. 4 and 5, in the configuration of a liquid crystal device 1, which is a non-limiting example of an electro-optical device according to the present embodiment of the invention, a TFT array substrate 10 and an opposite substrate (i.e., counter substrate) 20 are arranged opposite to each other. A liquid crystal layer 50 is sealed between the TFT array substrate 10 and the counter substrate 20. The TFT array substrate 10 and the counter substrate 20 are bonded to each other with the use of a sealant material 52 that is provided at a sealing region around an image display region 10*a*.

Inside the sealing region at which the sealant material 52 is provided and in parallel therewith, a picture frame light-shielding film 53, which has a light-shielding property and defines the picture-frame region of the image display region 10*a*, is provided on the counter substrate 20 as illustrated in FIG. 4. Notwithstanding the above, a part or a whole of such a picture frame light-shielding film 53 may be provided at the TFT array substrate (10) side as a built-in light-shielding film. Among the peripheral regions, which lie at the periphery of the image display region 10*a*, a data line driving circuit 101 and external circuit connection terminals 102 are provided at one region which lies outside the sealing region at which the sealant material 52 is provided in such a manner that these data line driving circuit 101 and external circuit connection terminals 102 are provided along one of four sides of the TFT array substrate 10. A sampling circuit 7 is provided inside the sealing region along one of four sides thereof in such a manner that the picture frame light-shielding film 53 encloses the sampling circuit 7. A pair of scanning line driving circuits 104 is provided inside the sealing region along two of four sides thereof that are not in parallel with the above one side in such a manner that each of the scanning line driving circuits 104 is enclosed by the picture frame light-shielding film 53. In addition to the above, a plurality of electric wirings 105 is provided along the remaining one side (i.e., one that is parallel with the first-mentioned side) of the TFT array substrate 10 in such a manner that the plurality of electric wirings 105 is enclosed by the picture frame light-shielding film 53 so as to connect one of the pair of the scanning line driving circuits 104 that are provided outside the image display region 10*a* along the second-mentioned two sides to the other thereof. Inter-substrate conductive terminals 106, which connect the TFT array substrate 10 with the counter substrate 20 by means of inter-substrate conductive material 107, are provided on the TFT array substrate 10 at positions corresponding to four corners of the counter substrate 20, respectively. With such a structure, it is possible to establish electric conduction between the TFT array substrate 10 and the counter substrate 20.

A wiring pattern 90 that provides electric connection between the external circuit connection terminals 102, the data line driving circuit 101, the scanning line driving circuit 104, the inter-substrate conductive terminals 106, though not necessarily limited thereto, is formed on the TFT array substrate 10. The wiring pattern 90 includes, but not limited to, a ground potential line that supplies a ground potential to the data line driving circuit 101 and the scanning line driving circuit 104, a power line that supplies a power potential VDD, which is higher than the ground potential, and a variety of signal lines that supply various kinds of signals such as a clock signal, a control signal, and the like. In addition to those described above, the wiring pattern 90 further includes a counter electrode potential line that supplies a counter electrode potential to a counter electrode (i.e., opposite/opposing electrode) 21 via the inter-substrate conductive terminals 106.

In FIG. 5, a layered structure that includes laminations of TFTs for pixel switching, which are driving/driver elements, and of wirings such scanning lines, data lines, and the like is formed on the TFT array substrate 10. In the image display region 10a, pixel electrodes 9a are arranged in a matrix pattern at a layer over the wiring structure of the pixel-switching TFTs, the scanning lines, the data lines, and the like. An alignment film (i.e., orientation film) is deposited on the pixel electrodes 9a. On the other hand, a light-shielding film 23 is deposited on the surface of the counter substrate 20 opposite the TFT array substrate 10. The light-shielding film 23 is made of, for example, a metal film having light-shielding property. The light-shielding film 23 is formed in a grid pattern in the image display region 10a on the counter substrate 20. The counter electrode 21, which is made of a transparent material such as indium tin oxide (ITO), is deposited on the light-shielding film 23 in a "solid" manner, that is, as a solid electrode, so as to cover the area in such a manner that the counter electrode is opposed to the plurality of pixel electrodes 9a. Another alignment film is deposited on the counter electrode 21. The liquid crystal layer 50 is made of liquid crystal that consists of, for example, a mixture of one or more types of nematic liquid crystal element. Such a liquid crystal takes a predetermined orientation state between a pair of the above orientation (i.e., alignment) films.

Although it is not specifically illustrated in the drawing, a test circuit, a test pattern, etc., for conducting an inspection on the quality, defects, or the like, of the liquid crystal device during the production process or before shipment thereof may be further provided on the TFT array substrate 10 in addition to the data line driving circuit 101 and the scanning line driving circuit 104.

Next, with reference to FIG. 6, an explanation is given below of the electric configuration of the pixel units of the liquid crystal device 1.

As illustrated in FIG. 6, the pixel electrode 9a and a TFT 30 is provided in each of the plurality of pixels that are arranged in a matrix pattern to constitute the image display region 10a. The TFT 30 is electrically connected to the pixel electrode 9a so as to perform switching control on the pixel electrode 9a at the time of operation of the liquid crystal device 1. Each of data lines 6a to which image signals are supplied is electrically connected to the source of the TFT 30. Image signals S1, S2, . . . , and Sn that are written on the data lines 6a may be supplied respectively in the order of appearance herein (i.e., in the order of S1, S2, . . . , and Sn) in a line sequential manner. Alternatively, an image signal may be supplied to each of a plurality of groups of the data lines 6a, where each group consists of a bundle of the data lines 6a adjacent to each other (one another).

Each of scanning lines 3 is connected to the gate of the TFT 30. The liquid crystal device 1 according to the present embodiment of the invention is configured to apply, at a predetermined timing and in a pulse pattern, scanning signals G1, G2, . . . , and Gm to the scanning lines 3a in the order of appearance herein in a line sequential manner. Each of the pixel electrodes 9a is electrically connected to the drain (region/electrode) of the TFT 30. When the switch of the TFT 30, which functions as a switching element, is closed for a certain time period, the image signal S1, S2, . . . , or Sn that is supplied through the data line 6a is written at a predetermined timing. After being written into liquid crystal, which is an example of electro-optical material, via the pixel electrodes 9a, the image signals S1, S2, . . . , and Sn having a predetermined level are held for a certain time period between the pixel electrode 9a and the counter electrode 21 formed on the opposite substrate.

Liquid crystal that constitutes the liquid crystal layer 50 changes its orientation and/or its order of molecular association depending on the level of a voltage that is applied thereto. By this means, it modulates light to realize a gradation display. Under a "normally-white" mode, the optical transmittance (i.e., light transmission factor) with respect to an incident light beam decreases in accordance with a voltage applied on a pixel-by-pixel basis (i.e., to each pixel), whereas, under a "normally-black" mode, the optical transmittance with respect to an incident light beam increases in accordance with a voltage applied on a pixel-by-pixel basis. Thus, when viewed as a whole, light having a certain contrast in accordance with an image signal is emitted from the liquid crystal device. In order to prevent the leakage of the image signals being held, a storage capacitor 70 is provided in parallel with a liquid crystal capacitor that is formed between the pixel electrode 9a and the counter electrode 21. One of two electrodes that constitute each of the storage capacitors 70 is electrically connected to the corresponding one of the pixel electrodes 9a, whereas the other thereof is electrically connected to the corresponding one of capacitor lines 300 each of which supplies a constant/fixed electric potential. The storage capacitor 70 is a capacitive element that functions as a hold capacitor (i.e., retention volume) for temporally holding the electric potential of each of the pixel electrodes 9a in accordance with the supply of an image signal. According to such a storage capacitor 70, the electric potential retention property at the pixel electrode 9a is improved, making it possible to improve display characteristics, which could be perceived as an enhanced contrast and/or reduced flickers.

Next, with reference to FIGS. 7-9, the specific configuration of the pixel units of the liquid crystal device 1 is explained below. In referring to FIGS. 7 and 8, it should be noted that different scales are used for layers/members illustrated in these drawings so that each of the layers/members has a size that is easily recognizable in each of these drawings. The same holds true for FIGS. 9-14, which will be referred to later. For convenience of explanation, in FIGS. 7 and 8, layer portions deposited above the pixel electrodes 9a are omitted from these drawings.

As illustrated in FIG. 7, the plurality of pixel electrodes 9a is arranged in a matrix pattern on the TFT array substrate 10. The data line 6a extends along a longitudinal boundary line between each two pixel electrodes 9a arrayed adjacent to each other. On the other hand, the scanning line 3a extends along a latitudinal boundary line between each two pixel electrodes 9a arrayed adjacent to each other. That is, each of the scanning lines 3a extends in the X direction, whereas each of the data lines 6a extends in the Y direction so as to intersect with the scanning lines 3a. At a position corresponding to each intersection where the data line 6a and the scanning line 3a intersect (traverse) each other, the pixel-switching TFT 30 is provided.

When viewed in two dimensions, that is, in a plan view, the scanning line 3a, the data line 6a, the storage capacitor 70, a lower light-shielding film 11a, the relay layer 93, and the TFT 30 are arranged inside a non-open region that surrounds the open (aperture) region of each pixel corresponding to the pixel electrode 9a (where "open" means a region in each pixel which transmits or reflects light that actually contributes to display, whereas "non-open" means a region which blocks and shuts off light) on the TFT array substrate 10. In other words, the scanning line 3a, the storage capacitor 70, the data line 6a, the lower light-shielding film 11a, and the TFT 30 are arranged not in the open region of each pixel but in the non-open region thereof so as not to obstruct display.

As illustrated in FIGS. 7 and 8, the TFT 30 is configured to include a semiconductor layer 1a and a gate electrode 31b. The gate electrode 31b is formed as a part of the scanning line 3a.

The semiconductor layer 1a is made of, for example, polysilicon. The semiconductor layer 1a consists of a channel region 1a', a lightly doped source region 1b, a lightly doped drain region 1c, a highly doped source region 1d, and a highly doped drain region 1e. That is, the TFT 30 has an LDD structure. The lightly doped source region 1b, the lightly doped drain region 1c, the highly doped source region 1d, and the highly doped drain region 1e are impurity regions that are formed by implanting impurities into the semiconductor layer 1a by using, for example, an ion implantation method, or other similar alternative technique. According to such an impurity region, it is possible to reduce the amount of an OFF-state current that flows in the source region and the drain region during the non-operating time of the TFT 30, and also to suppress the decrease of an ON-state current that flows during the operating time of the TFT 30. Although it is preferable that the TFT 30 should have an LDD structure, it may be configured to have an offset structure in which the implantation of impurities is not performed on the lightly doped source region 1b and the lightly doped drain region 1c. As another alternative example, impurities may be heavily doped (i.e., in high concentration) while using the gate electrode 3b as a mask so as to deposit the highly doped source region 1d and the highly doped drain region 1e; that is, it may have a self-aligned structure.

As illustrated in FIG. 5, each of the gate electrodes 3b is formed as a part of the scanning line 3a. The gate electrode 3b is made of, for example, conductive polysilicon. In addition to the main line portion that extends in the X direction, the scanning line 3a has a sub portion that extends in the Y direction so as to overlap a region of the channel region 1a' of the TFT 30 that the main line portion does not overlap. The portion of the scanning line 3a that overlaps the channel region 1a' in a plan view functions as the gate electrode 3b. A gate insulation film 2, which is made up of two layers of sub insulation films 2a and 2b, is sandwiched between the gate electrode 3b and the semiconductor layer 1a. With such a configuration the gate electrode 3b and the semiconductor layer 1a are insulated from each other.

The lower light-shielding film 11a is deposited in a grid array pattern at a layer below the TFT 30 with an underlying (i.e., base/ground) insulation film 12 being sandwiched therebetween. The lower light-shielding film 11a extends onto a peripheral region around the image display region 10a. At the peripheral region, the lower light-shielding film 11a is electrically connected to a ground potential line that supplies a ground potential GND to the data line driving circuit 101 and the scanning line driving circuit 104.

It should be noted that, in the present embodiment of the invention, the lower light-shielding film 11a may be made of an elemental metal, an alloy, a metal silicide, a polysilicide, or any lamination thereof, which contains at least one of a high melting point metal including but not limited to titanium (Ti), chromium (Cr), tungsten (W) tantalum (Ta), molybdenum (Mo), and palladium (Pd). Accordingly, thanks to the presence of the lower light-shielding film 11a, it is possible to shut off a return light that enters from the TFT-array-substrate (10) side into the device, thereby effectively protecting the channel region 1a' of the TFT 30 and its peripheral region.

The underlying insulation film 12 has a function of "layer-insulating" the pixel-switching TFT 30 from the lower light-shielding film 11a. In addition thereto, the underlying insulation film 12 that is formed on the entire surface of the TFT array substrate 10 has a function of preventing any degradation in the characteristics of the pixel-switching TFT 30, which is attributable to roughness of the surface of the TFT array substrate 10 caused at the time of surface polishing thereof, any stains that remain after washing, or the like.

As illustrated in FIG. 8, the storage capacitor 70 is provided over the TFT 30, which is provided over the TFT array substrate 10, with a first inter-bedded insulation film 41 being interposed between the storage capacitor 70 and the TFT 30.

The storage capacitor 70 consists of a lower capacitor electrode 71, an upper capacitor electrode 300a, and a dielectric film 75, where the lower capacitor electrode 71 and the upper capacitor electrode 300a are opposed to each other with the dielectric film 75 being interposed therebetween.

The upper capacitor electrode 300a is configured as a part of the capacitor line 300. The capacitor line 300 extends from the image display region 10a, at which the pixel electrodes 9a are provided, to the periphery thereof. The upper capacitor electrode 300a, which is electrically connected to a constant potential source via the capacitor line 300, is a constant-potential-side capacitor electrode that is maintained at a constant potential. The upper capacitor electrode 300a, which is made of, for example, an opaque metal film containing a metal or an alloy such as Al (aluminum), Ag (silver), and the like, also functions as an upper light-shielding film (built-in light-shielding film) that shuts light off to protect the TFT 30. It should be noted that the upper capacitor electrode 300a may be made of an elemental metal, an alloy, a metal silicide, a polysilicide, or any lamination thereof, which contains at least one of a high melting point metal including but not limited to titanium (Ti), chromium (Cr), tungsten (W) tantalum (Ta), molybdenum (Mo), and palladium (Pd).

The lower capacitor electrode 71, which is an example of "a first electro-conductive film" according to the second aspect of the invention, is a pixel-potential-side capacitor electrode that is electrically connected to the highly doped drain region 1e of the TFT 30 and the pixel electrode 9a. The lower capacitor electrode 71 is formed at a non-open region that isolates one open region from another open region in the layout of a plurality of pixels arrayed adjacent to one another. The lower capacitor electrode 71 is electrically connected to the pixel electrode 9a via the relay layer 93, which is an example of "a second electro-conductive film" according to the second aspect of the invention. In such a configuration, the relay layer 93 and the lower capacitor electrode 71 are electrically connected to each other via an end surface 71b of the lower capacitor electrode 71 only, which means that there is no other contact point therebetween. In addition, in such a configuration, the relay layer 93 is formed in a layer that is not the same as that of the lower capacitor electrode 71 with a second inter-bedded insulation film 42 being interposed therebetween.

The relay layer 93 is deposited (i.e., formed/configured) to partially cover the upper surface 42a of the second inter-bedded insulation film 42 and to further cover an end surface 42b of the second inter-bedded insulation film 42 and the end surface 71b of the lower capacitor electrode 71. In other words, the relay layer 93 extends from the upper surface 42a of the second inter-bedded insulation film 42 to reach the end surface 71b of the lower capacitor electrode 71 across the end surface 42b of the second inter-bedded insulation film 42. The relay layer 93 is electrically connected to the pixel electrode 9a via a contact hole 85. That is, a combination of the lower capacitor electrode 71 and the relay layer 93 functions to establish an electric connection between the highly doped drain region 1e and the pixel electrode 9a. Therefore, in the configuration of the liquid crystal device 1, it is possible to significantly reduce the size of a connection structure (i.e., the dimension of a connection area) that is made up of the lower capacitor electrode 71 and the relay layer 93, which is formed at the non-open region. Specifically, as illustrated in FIGS. 7 and 8, it is possible to significantly reduce the size of a protruding portion of the lower capacitor electrode 71 that extends, in a plan view, from the non-open region into the open region of a pixel at which the pixel electrode 9a is provided. More preferably, it is not theoretically impossible to eliminate the protruding portion of the lower capacitor electrode 71 completely. Therefore, in comparison with a configuration in which the lower capacitor electrode protrudes into the open region so that the lower capacitor electrode and the relay layer are electrically connected to each other in the open region, which is disadvantageous and undesirable, the liquid crystal device 1 according to the present embodiment of the invention makes it possible to reduce the dimension of the non-open region because the lower capacitor electrode 71 does not protrude into the open region. In addition, in the configuration of the liquid crystal device 1 according to the present embodiment of the invention, the relay layer 93 and the lower capacitor electrode 71 are electrically connected to each other via the end surface 71b of the lower capacitor electrode 71 only, which means that there is no other contact point therebetween. With such a configuration, in comparison with a configuration where the relay layer 93 and the lower capacitor electrode 71 are electrically connected to each other via a contact hole, the liquid crystal device 1 according to the present embodiment of the invention makes it possible to eliminate a margin space for formation of the contact hole that must be allocated if the relay layer 93 and the lower capacitor electrode 71 are electrically connected to each other via the contact hole. By this means, in the configuration of the liquid crystal device 1 according to the present embodiment of the invention, the light-shutting relay layer 93 and the light-shutting lower capacitor electrode 71 do not disadvantageously narrow the open region.

Therefore, the liquid crystal device 1 according to the present embodiment of the invention makes it possible to significantly reduce the dimension of a connection area that is required for electrically connecting the relay layer 93 and the lower capacitor electrode 71, where the relay layer 93, which is electrically connected to the pixel electrode 9a, is formed in a layer that is not the same as that of the lower capacitor electrode 71 with the second inter-bedded insulation film 42 being interposed therebetween. By this means, the liquid crystal device 1 according to the present embodiment of the invention makes it possible to increase the aperture ratio of each pixel, which results in enhanced display performance.

As an example of alternative configuration, the end surface 42b of the second inter-bedded insulation film 42 may be protruded toward/into the open region when viewed with respect to the end surface 71b of the lower capacitor electrode 71. In other words, the configuration of the liquid crystal device 1 according to the present embodiment of the invention may be modified as long as the end surface 71b of the lower capacitor electrode 71 does not lie at a protruded position closer to the open region in comparison with the end surface 42b of the second inter-bedded insulation film 42. Even in such a modified configuration, it is possible to electrically connect the relay layer 93 and the lower capacitor electrode 71 via an end surface 71b of the lower capacitor electrode 71 only, which means that there is no other contact point therebetween, if the film-deposition condition for formation of the relay layer 93 is set in a suitable manner.

In the illustrated configuration, the relay layer 93 is deposited at the same layer as the data lines 6a on the second inter-bedded insulation film 42. The data lines 6a and the relay layer 93 are formed by, firstly, depositing a thin film that is made of conductive material such as a metal film on the second inter-bedded insulation film 42 by means of a thin film deposition technique, and then by partially removing the thin film (i.e., patterning) so as to separate the data lines 6a from the relay layer 93. Therefore, the manufacturing process of the liquid crystal device 1 is simplified because the data lines 6a and the relay layer 93 can be produced in the same production step.

The lower capacitor electrode 71 is made of conductive polysilicon. Therefore, the capacitor storage 70 has a so-called metal-insulator-semiconductor (MIS) structure. In addition to its function as the pixel-electric-potential-side capacitor electrode, the lower capacitor electrode 71 has a second function as a light absorption layer or a light-shielding film that is deposited between the upper capacitor electrode 300a, which serves as the upper light-shielding film, and the TFT 30.

With reference to FIG. 9A, the layer structure of the relay layer 93 is explained below. As illustrated in FIG. 9A, the relay layer 93 has a multilayer structure, which is formed as a lamination of a titanium film 93a, a titanium nitride film 93b, an aluminum film 93c, and another titanium nitride film 93d. On the second inter-bedded insulation film 42, these component films are laminated one on another in the order of appearance herein to constitute the relay layer 93.

Since the relay layer 93 having the layer structure described above can "ohmic-contact" the lower capacitor electrode 71, which is made of a semiconductor film such as polysilicon or the like, it is possible to reduce a connection resistance between the relay layer 93 and the lower capacitor electrode 71. The aluminum film 93c, which has an electric conductivity higher than that of the titanium film 93a, enhances the electric conductivity of the relay layer 93. In addition, the titanium nitride films 93b and 93d function to prevent the aluminum film 93c from becoming oxidized. By this means, it is possible to avoid an increase in electric resistance of the relay layer 93. As illustrated in FIG. 9B, the connection structure described above may be modified in such a manner that the relay layer 93 is electrically connected to the lower capacitor electrode 71 having an end surface 71c that is protruded when viewed with respect to an end surface 61b of an insulation film 61.

Referring back to FIG. 8 (and FIG. 7), the dielectric film 75 has a monolithic structure or multi-tiered structure made of a silicon oxide film including but not limited to an HTO (High Temperature Oxide) film, an LTO (Low Temperature Oxide) film, or of a silicon nitride film, and the like.

It should be noted that the lower capacitor electrode 71 may be made of a metal film, that is, the same material as that of the upper capacitor electrode 300a. That is, the storage capacitor 70 may be configured to have a so-called metal-insulator-metal (MIM) structure, which has three layers consisting of a metal film - - - a dielectric film (insulator film) - - - a metal film. With such an MIM configuration, in comparison with a case where the lower capacitor electrode 71 is made of polysilicon or the like, it is possible to achieve a lower power consumption in the liquid crystal device as a whole at the time of driving the liquid crystal device, and to achieve a faster operation of elements in each of the pixel units.

As illustrated in FIG. 8, the data lines 6a and the relay layer 93 are provided in an upper layer above the storage capacitor 70, which is formed over the TFT array substrate 10. The second inter-bedded insulation film 42 is interposed between the storage capacitor 70 and the data lines 6a/relay layer 93. The insulation film 61 is partially interposed between the first inter-bedded insulation film 41 and the second inter-bedded insulation film 42.

The data line 6a is electrically connected to the highly doped source region 1d of the semiconductor layer 1a via a contact hole 81, which penetrates through the second inter-bedded insulation film 42, the insulation film 61, and the first inter-bedded insulation film 41. The data lines 6a and the inner portion of the contact hole 81 are made of Al (aluminum)-containing material such as Al—Si—Cu, Al—Cu, etc., or aluminum only, or alternatively, a multilayer film that consists of an Al layer and a TiN layer, or the like. The data lines 6a have an additional function of shutting light off to protect the TFT 30.

As illustrated in FIG. 8, the pixel electrode 9a is formed at the upper-layer side above the data line 6a with an third inter-bedded insulation film 43 being interposed therebetween. The pixel electrode 9a is electrically connected to the highly doped drain region 1e of the semiconductor layer 1a via the lower capacitor electrode 71, the contact holes 83 and 85, and the relay layer 93. The contact hole 85 is formed by depositing a film of a conductive material such as ITO that constitutes the pixel electrodes 9a in the inner wall of a hole that is formed to penetrate through the third inter-bedded insulation film 43.

An alignment film that is subjected to a predetermined orientation processing such as rubbing processing or the like is provided on the upper surface of the pixel electrodes 9a. In the configuration of the liquid crystal device 1 according to the present embodiment of the invention, the upper surface of the third inter-bedded insulation film 43 is smoothened by means of a chemical mechanical polishing (CMP) or other similar alternative technique. Therefore, it is possible to avoid the formation of uneven/rugged surface on, for example, an alignment film that is deposited on the pixel electrodes 9a. By this means, it is possible to effectively avoid any malfunctioning alignment (i.e., orientation) of liquid crystal molecules present in the liquid crystal layer 50 (refer to FIG. 5).

As understood from FIG. 7, the layer configuration explained above applies to each of the plurality of pixel units. In the image display region 10a (refer to FIG. 4) the pixel portions are provided in a cyclic pattern.

2-2 Method for Production of Electro-Optical Device

Next, with reference to FIGS. 10 and 11, a production method for manufacturing an electro-optical device according to the third aspect of the invention is explained below. FIGS. 10 and 11 is a set of sectional view that schematically illustrates major production steps/processes of a method for producing an electro-optical device according to the present embodiment of the invention. In the present embodiment of the invention, a method for producing the liquid crystal device 1 described above is explained. That is, in the following description, a method for producing a connection structure in which the lower capacitor electrode 71 and the relay layer 93 are electrically connected to each other is mainly explained. It should be noted that, in the actual implementation of the invention, other portions of the liquid crystal device 1 are manufactured either concurrently with or before/after the production of the unique connection structure described above.

Figure 10A:
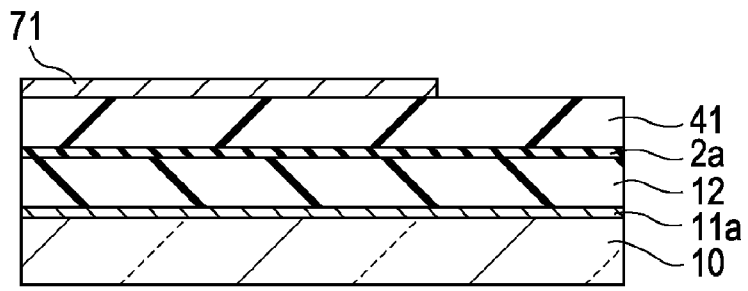
FIGS. 10A, 10B, and 10C is a first-half set of sectional view that schematically illustrates major production steps/processes of a method for producing an electro-optical device according to the second embodiment of the invention.
Figure 10B:
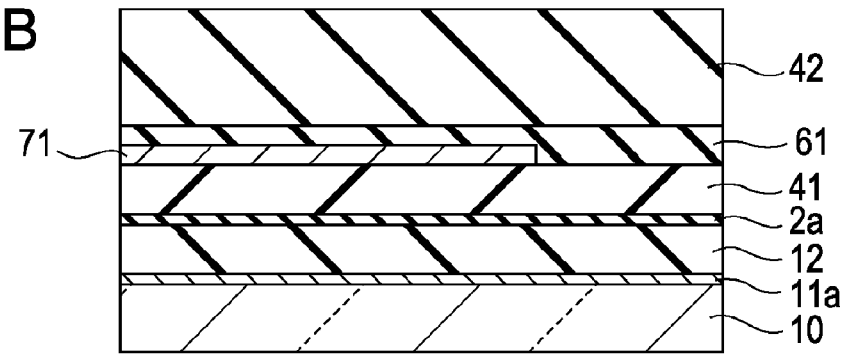

As illustrated in FIG. 10A, as a first step, the lower light-shielding film 11a, the underlying insulation film 12, the (sub) insulation film 2a, the first inter-bedded insulation film 41, and the lower capacitor electrode 71 are deposited on the TFT array substrate 10, which are laminated in the order of appearance herein. As a next step, as illustrated in FIG. 10B, the insulation film 61 is deposited so as to cover the lower capacitor electrode 71. Then, the second inter-bedded insulation film 42 is deposited on the insulation film 61.

Figure 10C:
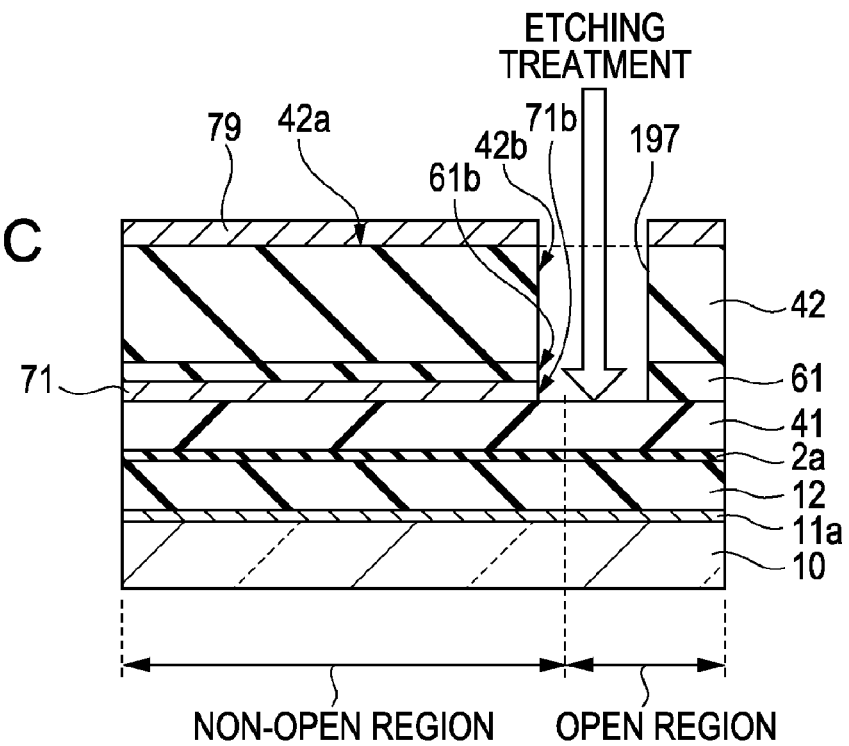

Then, as illustrated in FIG. 10C, a part of the insulation film 61 and a part of the second inter-bedded insulation film 42 are removed in such a manner that the end surface 71b of the lower capacitor electrode 71 is exposed toward the open region. A dry etching method is used for removing a part of the insulation film 61 and a part of the second inter-bedded insulation film 42. Specifically, dry etching is performed as follows. As a preparation step, a resist film 79 is formed on the upper surface of the second inter-bedded insulation film 42 in a predetermined pattern. Subsequently, the part of the insulation film 61 and the part of the second inter-bedded insulation film 42 are subjected to etching processing by means of dry etching, which is applied over the resist film 79. Through these dry etching steps, a hole portion 197, which exposes the end surface 71b of the lower capacitor electrode 71, is formed. In comparison with a case where a wet etching technique is used, it is possible to remove the part of the insulation film 61 and the part of the second inter-bedded insulation film 42 in a selective manner so as to expose the end surface 71b of the lower capacitor electrode 71 only by means of the dry etching technique.

Figure 11D:
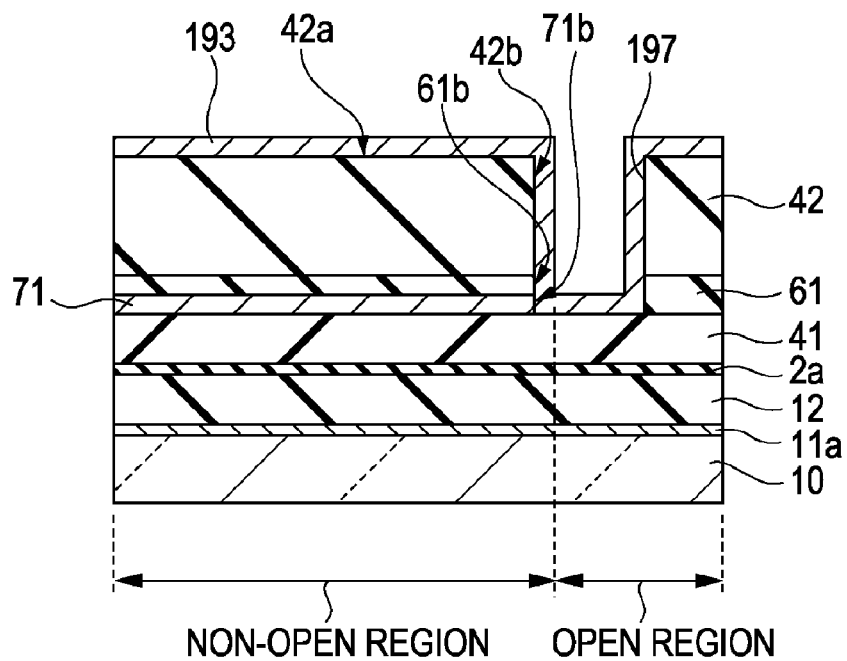
FIGS. 11D and 11E is a second-half set of sectional view that schematically illustrates major production steps/processes of a method for producing an electro-optical device according to the second embodiment of the invention.
Figure 11E:
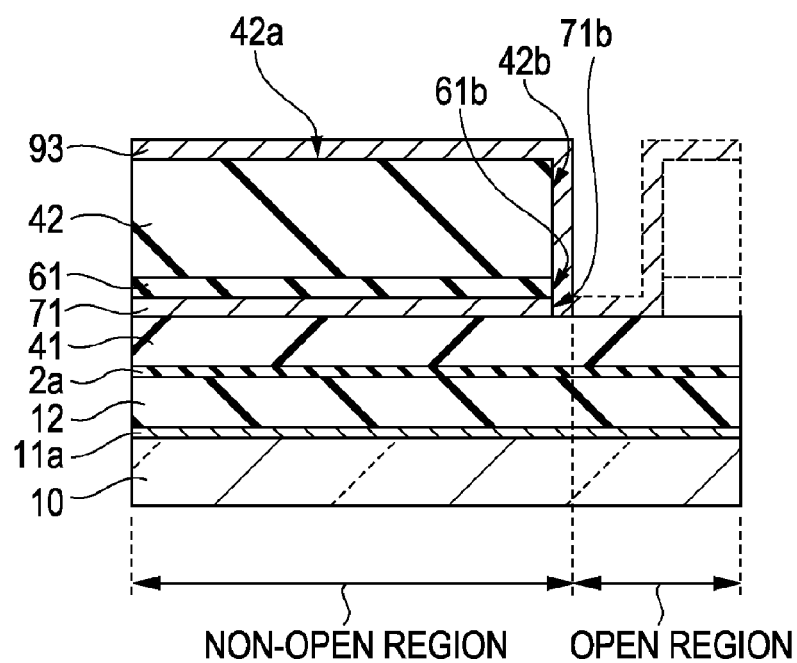

Next, as illustrated in FIG. 11D, after removal of the resist film 79, an electro-conductive film 193 is deposited. The electro-conductive film 193 is formed to cover the upper surface 42a of the second inter-bedded insulation film 42, the end surface 42b thereof, the end surface 61b of the insulation film 61, and the end surface 71b of the lower capacitor electrode 71 in such a manner that it extends from the upper surface 42a of the second inter-bedded insulation film 42 to reach the end surface 71b of the lower capacitor electrode 71 across the end surface 42b of the second inter-bedded insulation film 42 and the end surface 61b of the insulation film 61. In other words, the electro-conductive film 193 extends, from the upper surface 42a of the second inter-bedded insulation film 42, along the inner wall surface of the hole portion 197. The electro-conductive film 193 is in contact with the end surface 71b of the lower capacitor electrode 71. Next, as illustrated in FIG. 11E, an "open-region" part of the electro-conductive film 193, an open-region part of the second inter-bedded insulation film 42, and an open-region part of the insulation film 61 are removed in a selective manner. By this means, the relay layer 93, which is electrically connected to the end surface 71b of the lower capacitor electrode 71, is formed. Thereafter, other layer components such as the third inter-bedded insulation film 43, the pixel electrodes 9a, and the like, are formed thereon. In this way, the liquid crystal device 1 described above is manufactured.

Thus, a method for producing the liquid crystal device 1, which is an example of an electro-optical device, according to the present embodiment of the invention makes it possible to significantly reduce the dimension of a non-open region that narrows an open region. By this means, a method for producing the liquid crystal device 1 according to the present embodiment of the invention makes it possible to increase the aperture ratio of each pixel, which results in enhanced display performance of the liquid crystal device 1.

Third Embodiment 3-1 Electro-Optical Device

Next, with reference to FIG. 12, the layer structure of a liquid crystal device 800, which is an example of an electro-optical device according to the fourth aspect of the invention, is explained below. FIG. 12 is a sectional view that schematically illustrates an exemplary configuration of pixel units of the liquid crystal device 800 according to the present embodiment of the invention. The liquid crystal device 800 according to the present embodiment of the invention has substantially the same configuration as that of the liquid crystal device 1 described above. Therefore, in the following description, the same reference numerals are assigned to the same components as those of the liquid crystal device 1, and detailed explanation thereof is omitted. The characteristic part of the configuration of the liquid crystal device 800 according to the present embodiment of the invention is described in detail below. In the present embodiment of the invention, the semiconductor layer 1a is taken as an example of an "electro-conductive layer" according to the fourth aspect of the invention. Accordingly, a "data-line-side electro-conductive portion" and "a pixel-electrode-side electro-conductive portion" are taken as an example of "a first portion" and "a second portion" according to the fourth aspect of the invention, respectively. Notwithstanding the foregoing, the first portion and the second portion (recited in the appended claims) are in no case limited to these electro-conductive portions, respectively. That is, any other alternative set of two electro-conductive portions each of which constitutes a part of the electro-conductive layer formed in the liquid crystal device 800 (electro-optical device) may constitute the first portion and the second as long as one of the above-mentioned two electro-conductive portions has an electric potential different from that of the other. Just in the same manner as done by the "data-line-side electro-conductive portion" and the "pixel-electrode-side electro-conductive portion", which are explicitly taken as an example of "the first portion" and "the second portion" according to the fourth aspect of the invention, respectively, such an alternative set of two electro-conductive portions offers advantageous effects that are unique to an electro-optical device according to the fourth aspect of the invention. A detailed explanation of the unique advantageous effects of the invention will be given later.

As illustrated in FIG. 12, the liquid crystal device 800 has the semiconductor layer 1a, which is formed at a non-open region that isolates one open region from another open region in the layout of a plurality of pixels arrayed adjacent to one another. The non-open region (specifically, semiconductor layer 1a) has a first region D1 and a second region D2 over the TFT array substrate 10. The first region D1 and the second region D2 do not overlap each other in a plan view. The highly doped source region 1d, which constitutes a part of the semiconductor layer 1a, is formed in the first region D1. In addition, insulating portions 41p1, 2a1, and 2b1 are disposed to partially overlap the first region D1. Further in addition, a part of a first electro-conductive film 91 is formed over the first region D1. On the other hand, the highly doped drain region 1e, which constitutes another part of the semiconductor layer 1a, is formed in the second region D2. In addition, insulating portions 41p2, 2a2, and 2b2 are disposed to partially overlap the second region D2. Further in addition, a part of a second electro-conductive film 92 is formed over the second region D2. In the exemplary configuration described above, the semiconductor layer 1a is taken as an example of an "electro-conductive layer" according to the fourth aspect of the invention. The highly doped source region 1d is taken as an example of the "data-line-side electro-conductive portion" according to the fourth aspect of the invention. A combination of the insulating portions 41p1, 2a1, and 2b1 is taken as an example of "a first insulating portion" according to the fourth aspect of the invention. The highly doped drain region 1e is taken as an example of the "pixel-electrode-side electro-conductive portion" according to the fourth aspect of the invention. Finally, a combination of the insulating portions 41p2, 2a2, and 2b2 is taken as an example of "a second insulating portion" according to the fourth aspect of the invention.

The combination of the insulating portions 41p1, 2a1, and 2b1 has (i.e., forms) a first sloped surface 41s1, which is inclined "downward" with respect to the upper surface of the highly doped source region 1d when viewed along a direction from the first region D1 toward the second region D2 across an isolation region that is formed between the first region D1 and the second region D2. Thus, with such a configuration, the vertical distance (i.e., height) between any arbitrary point on the slope and the corresponding point on the surface of the highly doped source region 1d becomes smaller as the above-mentioned arbitrary point on the slope comes closer to the intersection formed by the slope and the surface of the highly doped source region 1d (i.e., apex). The combination of the insulating portions 41p1, 2a1, and 2b1 is disposed to partially cover the surface of the highly doped source region 1d, leaving some "exposed" (i.e., not covered by the insulating portions 41p1, 2a1, and 2b1) portion thereof. The exposed portion of the first region D1 constitutes a first-portion region D1a. The exposed first-portion region D1a of the first region D1 is closer to the isolation region that is formed between the first region D1 and the second region D2 than the unexposed region of the first region D1. In such a configuration, the isolation region formed between the first region D1 and the second region D2 (partially) overlaps (i.e., underlies) the gate electrode 3b in a plan view.

The combination of the insulating portions 41p2, 2a2, and 2b2 has a second sloped surface 41s2, which is inclined "downward" with respect to the upper surface of the highly doped drain region 1e when viewed along a direction from the second region D2 toward the first region D1 across an isolation region that is formed between the first region D1 and the second region D2 (inclined "upward" when viewed along a direction from the first region D1 toward the second region D2) (thus, with such a configuration, the vertical distance between any arbitrary point on the slope and the corresponding point on the surface of the highly doped drain region 1e becomes smaller as the above-mentioned arbitrary point on the slope comes closer to the intersection formed by the slope and the surface of the highly doped drain region 1e). The combination of the insulating portions 41p2, 2a2, and 2b2 is disposed to partially cover the surface of the highly doped drain region 1e, leaving some "exposed" (i.e., not covered by the insulating portions 41p2, 2a2, and 2b2) portion thereof. The exposed portion of the second region D2 constitutes a second-portion region D2a. The exposed second-portion region D2a of the second region D2 is closer to the isolation region that is formed between the first region D1 and the second region D2 than the unexposed region of the second region D2. In such a configuration, again, the isolation region formed between the first region D1 and the second region D2 overlaps the gate electrode 3b in a plan view. The combination of the insulating portions 41p2, 2a2, and 2b2 is disposed on the same layer as that of the combination of the insulating portions 41p1, 2a1, and 2b1.

The first electro-conductive film 91 extends from the upper surface of the insulating portion 41p1 onto the first sloped surface 41s1. The first electro-conductive film 91 further extends from the first sloped surface 41s1 to reach the upper surface of the highly doped source region 1d. The second electro-conductive film 92 extends from the upper surface of the insulating portion 41p2 onto the second sloped surface 41s2. The second electro-conductive film 92 further extends from the second sloped surface 41s2 to reach the upper surface of the highly doped drain region 1e. The second electro-conductive film 92 has an electric potential that is not the same as one supplied to the first electro-conductive film 91.

Therefore, at the time of operation of the liquid crystal device 800, a coupling capacitance tends to be generated between the first electro-conductive film 91 and the second electro-conductive film 92. However, in the configuration of the liquid crystal device 800 according to the present embodiment of the invention, because the gap between the first sloped surface 41s1 and the second sloped surface 41s2 is widened by gradual degrees thanks to the inclination of each of the first sloped surface 41s1 and the second sloped surface 41s2, which means that the gap between the first electro-conductive film 91 and the second electro-conductive film 92 is also widened by gradual degrees in comparison with a case where the distance therebetween is constant, it is possible to reduce a coupling capacitance that is generated because of an electric potential difference between the first electro-conductive film 91 and the second electro-conductive film 92. Specifically, the liquid crystal device 800 according to the present embodiment of the invention makes it possible to reduce a coupling capacitance that is generated between the source of the TFT 30 and the drain thereof.

That is, the liquid crystal device 800 according to the present embodiment of the invention makes it possible to reduce a coupling capacitance that is generated between the second electro-conductive film 92 that is electrically connected to the pixel electrode 9a and the first electro-conductive film 91 that is electrically connected to the data line 6a. By this means, the liquid crystal device 800 according to the present embodiment of the invention makes it possible to significantly reduce the occurrences of display problems such as a crosstalk, though not limited thereto, which is caused by a coupling capacitance that is generated on a signal supply path on which an image signal travels.

As in the liquid crystal device 1 according to the second embodiment of the invention, in the configuration of the liquid crystal device 800 according to the present embodiment of the invention, the first electro-conductive film 91 and the second electro-conductive film 92 may have a titanium film that contacts the highly doped source region 1d and the highly doped drain region 1e, respectively. If the first electro-conductive film 91 is configured to contain a titanium film, it is possible to ohmic-contact the highly doped source region 1d, which constitutes a part of the semiconductor layer 1a that is made of polysilicon or the like, and the first electro-conductive film 91. By this means, it is possible to reduce a connection resistance between the first electro-conductive film 91 and the semiconductor layer 1a. Similarly, if the second electro-conductive film 92 is configured to contain a titanium film, it is possible to ohmic-contact the highly doped drain region 1e, which constitutes another part of the semiconductor layer 1a that is made of polysilicon or the like, and the second electro-conductive film 92. By this means, it is possible to reduce a connection resistance between the second electro-conductive film 92 and the semiconductor layer 1a.

Each of the first electro-conductive film 91 and the second electro-conductive film 92 may have a multilayer structure, which is formed as a lamination of a titanium film, a titanium nitride film, an aluminum film, and another titanium nitride film. On the semiconductor layer 1a, these component films are laminated one on another in the order of appearance herein to constitute each of the first electro-conductive film 91 and the second electro-conductive film 92. With such a configuration, the aluminum film, which has an electric conductivity higher than that of the titanium film, enhances the electric conductivity of each of the first electro-conductive film 91 and the second electro-conductive film 92. In addition, the titanium nitride films function to prevent the aluminum film from becoming oxidized. By this means, it is possible to avoid an increase in electric resistance of each of the first electro-conductive film 91 and the second electro-conductive film 92.

3-2 Method for Production of Electro-Optical Device

Next, with reference to FIGS. 13 and 14, a production method for manufacturing an electro-optical device according to the fifth aspect of the invention is explained below. FIGS. 13 and 14 is a set of sectional view that schematically illustrates major production steps/processes of a method for producing an electro-optical device according to the present embodiment of the invention. In the present embodiment of the invention, a production method for manufacturing the liquid crystal device 800 described above, which is an example of an electro-optical device, is explained.

As illustrated in FIG. 13A, as a first step, the semiconductor layer 1a is formed at a non-open region that isolates one open region from another open region in the layout of a plurality of pixels arrayed adjacent to one another, where each of the plurality of pixels in which the pixel electrode 9a is provided is formed at a position corresponding to an intersection formed by each of a plurality of data lines and each of a plurality of scanning lines, which extend in directions orthogonal to each other on the TFT array substrate 10. The non-open region (specifically, semiconductor layer 1a) has a first region D1 and a second region D2 over the TFT array substrate 10. The first region D1 and the second region D2 do not overlap each other in a plan view. The highly doped source region 1d, which constitutes a part of the semiconductor layer 1a, is formed in the first region D1. On the other hand, the highly doped drain region 1e, which constitutes another part of the semiconductor layer 1a, is formed in the second region D2. In order to facilitate the understanding of a production method for manufacturing an electro-optical device according to the present embodiment of the invention, in the illustrated layer structure, component regions such as the highly doped source region 1d, the highly doped drain region 1e, and the like have been pre-formed in the semiconductor layer 1a. However, the invention shall not be understood to be limited to the illustrated example. That is, it may be modified in such a manner that these constituent element regions are formed not before but after the formation of the gate electrode 3b by implanting predetermined impurities into predetermined regions of the semiconductor layer 1a in a selective manner.

As a second step, as illustrated in FIG. 13B, the sub-insulation films 2a and 2b, a part of which constitutes a gate insulation film, are disposed on the semiconductor layer 1a so as to form the gate electrode 3b. Thereafter, the first inter-bedded insulation film 41 is formed over the gate electrode 3b to cover the semiconductor layer 1a.

As a next step, as illustrated in FIG. 13C, the first inter-bedded insulation film 41 as well as the sub-insulation films 2a and 2b are etched away by means of a dry etching method. As the result of dry etching, a first hole portion 141a and a second hole portion 141b, each of which penetrates through the first inter-bedded insulation film 41 as well as the sub-insulation films 2a and 2b, are formed.

The first hole portion 141a, which goes through the first inter-bedded insulation film 41 as well as the sub-insulation films 2a and 2b, exposes a part of the highly doped source region 1d within the first region D1. The first hole portion 141a has a first sloped surface, which is inclined "downward" with respect to the upper surface of the highly doped source region 1*d* when viewed along a direction from the first region D1 toward the second region D2 across the isolation region that is formed between the first region D1 and the second region D2. Thus, with such a configuration, the vertical distance (i.e., height) between any arbitrary point on the slope and the corresponding point on the surface of the highly doped source region 1*d* becomes smaller as the above-mentioned arbitrary point on the slope comes closer to the intersection formed by the slope and the surface of the highly doped source region 1*d* (i.e., apex). The first sloped surface is an example of "a first inner wall surface" according to the fifth aspect of the invention.

The second hole portion 141*b*, which also goes through the first inter-bedded insulation film 41 as well as the sub-insulation films 2*a* and 2*b*, exposes a part of the highly doped drain region 1*e* within the second region D2. The second hole portion 141*b* has a second sloped surface, which is inclined "downward" with respect to the upper surface of the highly doped drain region 1*e* when viewed along a direction from the second region D2 toward the first region D1 across the isolation region that is formed between the first region D1 and the second region D2 (inclined "upward" when viewed along a direction from the first region D1 toward the second region D2) (thus, with such a configuration, the vertical distance between any arbitrary point on the slope and the corresponding point on the surface of the highly doped drain region 1*e* becomes smaller as the above-mentioned arbitrary point on the slope comes closer to the intersection formed by the slope and the surface of the highly doped drain region 1*e*). The second sloped surface is an example of "a second inner wall surface" according to the fifth aspect of the invention. As the bottom of the first hole portion 141*a*, a part of the surface of the highly doped source region 1*d* is exposed. The exposed part of the highly doped source region 1*d* constitutes a first exposed portion 142*a*. On the other hand, as the bottom of the second hole portion 141*b*, a part of the surface of the highly doped drain region 1*e* is exposed. The exposed part of the highly doped drain region 1*e* constitutes a second exposed portion 142*b*.

Figure 14D:
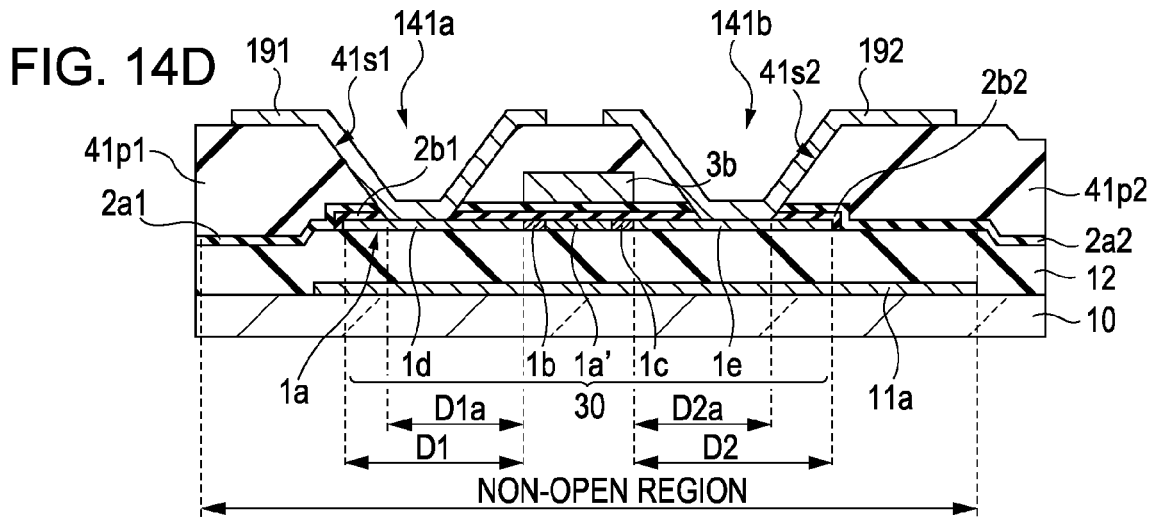
FIGS. 14D, 14E, and 14F is a second-half set of sectional view that schematically illustrates major production steps/processes of a method for producing an electro-optical device according to the third embodiment of the invention.

Next, as illustrated in FIG. 14D, a first electro-conductive film 191 and a second electro-conductive film 192, which constitute an example of an "electro-conductive film" according to the fifth aspect of the invention, are formed. The first electro-conductive film 191 extends from the upper surface of the first inter-bedded insulation film 41 to reach the first exposed portion 142*a*. On the other hand, the second electro-conductive film 192 extends from the upper surface of the first inter-bedded insulation film 41 to reach the second exposed portion 142*b*.

Figure 14E:
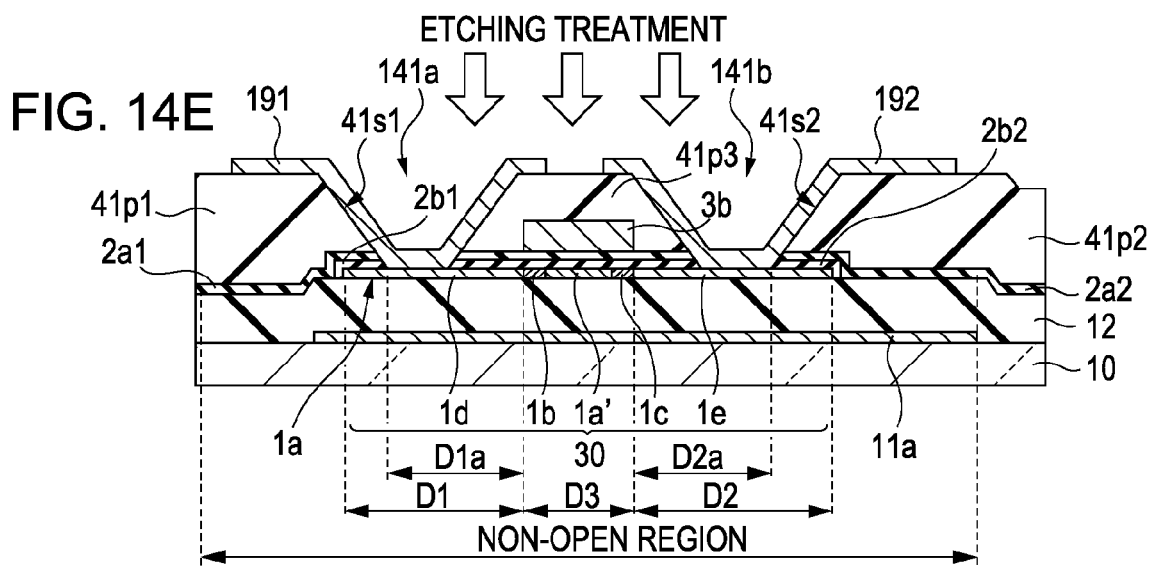
Figure 14F:
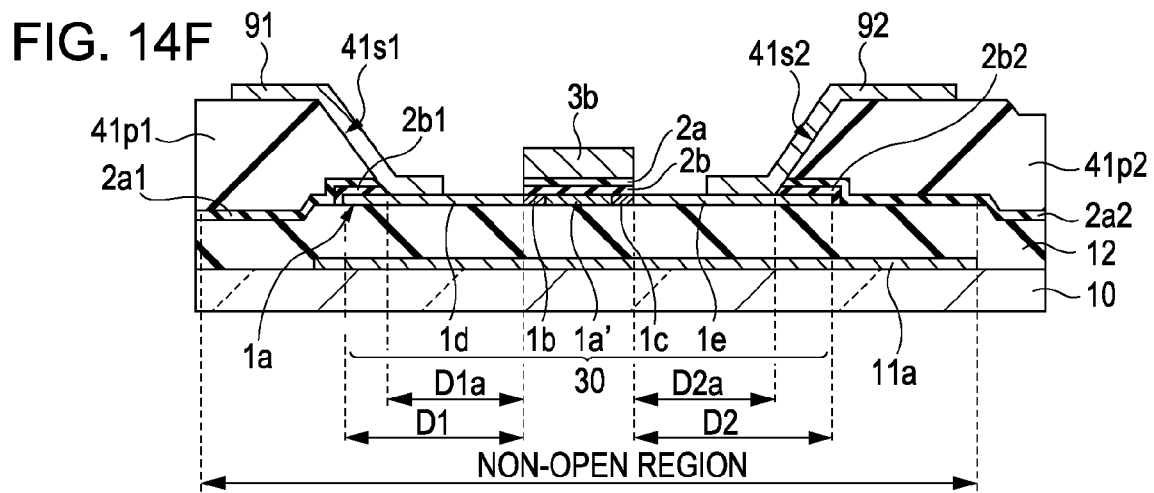

As illustrated in FIG. 14E, as a next step, a part of the first electro-conductive film 191 and a part of the second electro-conductive film 192 as well as an insulation film (i.e., insulating portion) 41*p*3 are removed by etching treatment. Specifically, these films are etched away at the following selected regions: an isolation region D3 that is interposed between the first region D1 and the second region D2, the inner part of the first-portion region D1*a* of the first region D1 that is closer to the isolation region D3 than the remaining outer part of the first-portion region D1*a* of the first region D1, and the inner part of the second-portion region D2*a* of the second region D2 that is closer to the isolation region D3 than the remaining outer part of the second-portion region D2*a* of the second region D2. A dry etching method, according to which the ratio of gas components to be ejected onto the insulation film and the electro-conductive film is adjustable, is used for selectively removing the part of the first electro-conductive film 191 and the part of the second electro-conductive film 192 as well as the insulation film 41*p*3. That is, since the component ratio of gas (i.e., gas ratio) that is to be ejected onto an etching target region can be adjusted if a dry etching method is adopted, it is possible to selectively etch away the isolation region D3 interposed between the first region D1 and the second region D2, the inner part of the first-portion region D1*a* that is closer to the isolation region D3 than the outer part thereof, and the inner part of the second-portion region D2*a* that is closer to the isolation region D3 than the outer part thereof.

When the dry etching treatment is applied to these films, each of the highly doped source region 1*d* and the highly doped drain region 1*e* functions also as (i.e., doubles as) an etching stopper, which prevents other layer components that are disposed under the semiconductor layer 1*a* from being etched away.

Through a series of manufacturing steps described above, as illustrated in FIG. 14F, the first electro-conductive film 91 and the second electro-conductive film 92, which extend, from the upper surface of the insulating portion 41*p*1 and the upper surface of the insulating portion 41*p*2, downward along the first sloped surface 41*s*1 and the second sloped surface 41*s*2 to reach the upper surface of the highly doped source region 1*d* and the upper surface of the highly doped drain region 1*e*, respectively, are formed. Thereafter, other layer components such as the second inter-bedded insulation film 42, the pixel electrodes 9*a*, and the like, are formed thereon. In this way, the liquid crystal device 800 described above is manufactured.

Thus, a method for producing the liquid crystal device 800, which is an example of an electro-optical device, according to the present embodiment of the invention makes it possible to widen the gap between the first electro-conductive film 91 and the second electro-conductive film 92 by gradual degrees thanks to the inclination of each of the first sloped surface 41*s*1 and the second sloped surface 41*s*2. By this means, a method for producing the liquid crystal device 800 according to the present embodiment of the invention makes it possible to reduce a coupling capacitance that is generated at the time of operation of the liquid crystal device 800. Thus, the production method according to the present embodiment of the invention offers an electro-optical device that is substantially free from display problems such as a crosstalk, though not limited thereto.

Electronic Apparatus

Next, with reference to FIG. 15, one exemplary application of the electro-optical device described above to an electronic apparatus is explained below. FIG. 15 is a plan view that schematically illustrates an example of the configuration of an electronic apparatus that is provided with the electro-optical device described above; and more specifically, FIG. 15 schematically illustrates, in a plan view, an example of the configuration of a projector that employs the above-described liquid crystal device as a light valve.

Figure 15:
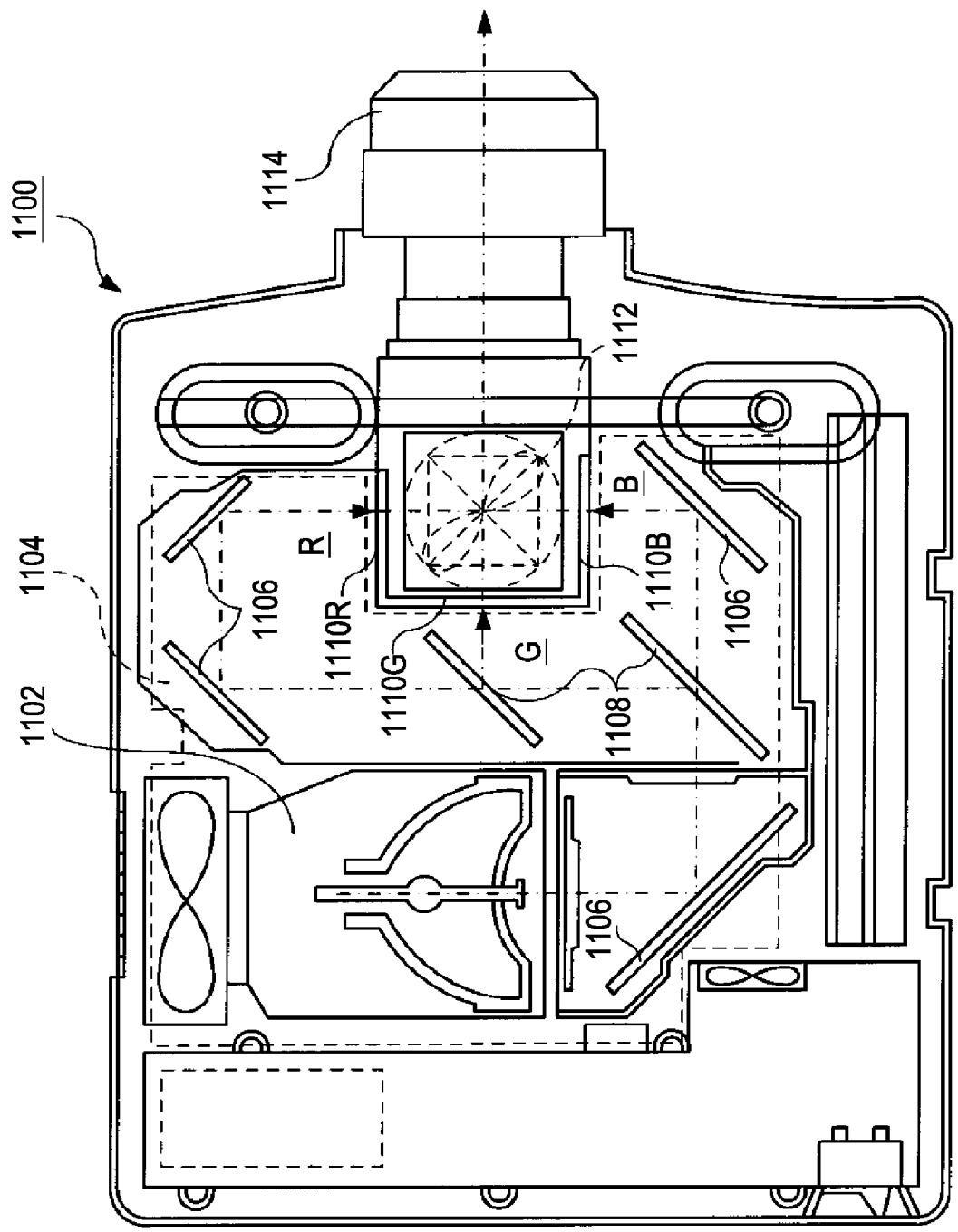
FIG. 15 is a plan view that schematically illustrates an example of the configuration of an electronic apparatus to which the electro-optical device according to a second aspect of the invention or a fourth aspect of the invention is applied.

As illustrated in FIG. 15, a lamp unit 1102, which is made of a white light source such as a halogen lamp, or the like, is provided in a projector 1100. A projection light that is emitted from the lamp unit 1102 is separated into three primary color components of R, G, and B by four mirrors 1106 and two dichroic mirrors 1108 arranged in a light guide 1104. The separated primary color components of R, G, and B enter liquid crystal panels 1110R, 1110B, and 1110G, respectively, which function as light valves corresponding to the respective primary color components.

The configuration of the liquid crystal panel 1110R, 1110G, or 1110B is the same as or similar to that of the liquid crystal device described above. Each of these liquid crystal panels 1110R, 110G, and 1110B is driven by the corresponding one of the primary color signals R, G, and B, which are supplied from the image signal processing circuit. Light subjected to optical modulation by one of these liquid crystal panels enters a dichroic prism 1112 from the corresponding one of three directions. Light of R color component and light of B color component are refracted at a 90-degree angle at the dichroic prism 1112, whereas light of G color component goes straight through the dichroic prism 1112. Therefore, as a result of combination of these color components, a color image is projected on a screen, etc., through a projection lens 1114.

Focusing attention on a display image offered by each of the liquid crystal panels 1110R, 1110G, and 1110B, it is necessary to reverse the display image of the liquid crystal panel 1110G in a mirror pattern (that is, reverse the left side and the right side) with respect to the display images of the liquid crystal panels 1110R and 1110B.

Because light corresponding to each one of the primary colors R, G, and B enters into the corresponding one of the liquid crystal panel 1110R, 1110G, and 1110B thanks to the presence of the dichroic mirror 1108, it is not necessary to provide a color filter thereon.

Among a variety of electronic apparatuses to which the electro-optical device according to the invention could be embodied are, in addition to the electronic apparatus (projector) explained above with reference to FIG. 15, a mobile-type personal computer, a mobile phone, a liquid crystal display television, a viewfinder-type video recorder, a video recorder of a direct monitor view type, a car navigation device, a pager, an electronic personal organizer, an electronic calculator, a word processor, a workstation, a videophone, a POS terminal, a touch-panel device, and so forth. Needless to say, the invention is also applicable to these various electronic apparatuses without any limitation to those mentioned above.

The present invention should in no case be interpreted to be limited to the specific embodiments described above. The invention may be modified, altered, changed, adapted, and/or improved within a range not departing from the gist and/or spirit of the invention apprehended by a person skilled in the art from explicit and implicit description given herein as well as appended claims. A connection structure subjected to such a modification, alteration, change, adaptation, and/or improvement, an electro-optical device having such a connection structure subjected thereto, and a method for producing such an electro-optical device, are also within the technical scope of the invention.

What is claimed is:

1. A connection structure comprising:
   a substrate;
   a first insulation film located over the substrate;
   a first electro-conductive film located directly over the substrate first insulation film;
   a second insulation film located over the first electro-conductive film, an end surface of the second insulation film facing in a direction in which an end surface of the first electro-conductive film faces;
   a second electro-conductive film that extends from the upper surface of the second insulation film to reach the end surface of the first electro-conductive film across the end surface of the second insulation film, the second electro-conductive film being electrically connected to the first electro-conductive film only via the end surface of the first electro-conductive film,
   a third insulation film located over the second electro-conductive film; and
   a third electro-conductive film connected to the second electro-conductive film at the region where the second electro-conductive film is connected to the upper surface of the second insulation film.

2. An electro-optical device comprising:
   a plurality of data lines and a plurality of scanning lines that intersect with each other on a substrate;
   a plurality of pixels located at positions corresponding to intersections at the plurality of data lines and the plurality of scanning lines that intersect with each other, each pixel including a pixel electrode, an open region formed in the substrate which is capable of transmitting or reflecting light in the pixel, and a non-open region formed in the substrate, the non-open regions comprising a semiconductor layer formed above a light-shielding film formed on the substrate which isolates one open region formed in the substrate from another open region of the substrate in a layout of the plurality of pixels arrayed adjacent to one another on the substrate;
   a first electro-conductive film that is formed at a non-open region, the first electroconductive film being electrically connected to the pixel electrode, the first electroconductive film having an end surface that faces toward the open region;
   a first insulation film that is formed on the first electro-conductive film, an end surface of the first insulation film facing toward the open region;
   a second electro-conductive film that extends from the upper surface of the first insulation film to reach the end surface of the first electro-conductive film across the end surface of the first insulation film, the second electro-conductive film being electrically connected to the first electro-conductive film via the end surface of the first electroconductive film; and
   a second insulation film including a contact hole and being formed on the second electro-conductive film, the pixel electrode being formed on the second insulation film and being electrically connected to the second electro-conductive film via the contact hole,
   wherein the second electro-conductive film includes a connection portion that is connected to the end surface of the first electro-conductive film at a position that is nearer to the open region than the contact hole in plan view.

3. The electro-optical device according to claim 2, wherein the second electro-conductive film is an island-pattern relay layer that electrically connects the first electro-conductive film and the pixel electrode; and a portion of the second electro-conductive film that extends on the upper surface of the first insulation film is formed at the same layer as the data line.

4. The electro-optical device according to claim 2, wherein the first electro-conductive film is a semiconductor film; and the second electro-conductive film has a titanium film that contacts the semiconductor film.

5. The electro-optical device according to claim 4, wherein the second electro-conductive film has a metal film having an electric conductivity higher than that of the titanium film; and the second electro-conductive film further has a protective film that protects the metal film.

\* \* \* \* \*